(12) United States Patent
Pei et al.

(10) Patent No.: US 11,942,464 B2
(45) Date of Patent: Mar. 26, 2024

(54) SEMICONDUCTOR PACKAGE AND METHOD

(71) Applicant: Taiwan Semiconductor Manufacturing Company, Ltd., Hsinchu (TW)

(72) Inventors: Hao-Jan Pei, Hsinchu (TW); Hsiu-Jen Lin, Zhubei (TW); Wei-Yu Chen, Taipei (TW); Philip Yu-Shuan Chung, Taipei (TW); Chia-Shen Cheng, Hsinchu (TW); Kuei-Wei Huang, Hsinchu (TW); Ching-Hua Hsieh, Hsinchu (TW); Chung-Shi Liu, Hsinchu (TW); Chen-Hua Yu, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 17/379,365

(22) Filed: Jul. 19, 2021

(65) Prior Publication Data

US 2021/0351172 A1    Nov. 11, 2021

Related U.S. Application Data

(63) Continuation of application No. 16/148,465, filed on Oct. 1, 2018, now Pat. No. 11,069,671.
(Continued)

(51) Int. Cl.
*H01L 25/00* (2006.01)
*H01L 21/48* (2006.01)
(Continued)

(52) U.S. Cl.
CPC .......... *H01L 25/50* (2013.01); *H01L 21/4853* (2013.01); *H01L 21/4857* (2013.01);
(Continued)

(58) Field of Classification Search
CPC ..... H01L 25/50; H01L 24/20; H01L 23/3128; H01L 23/5384; H01L 21/6835;
(Continued)

(56) References Cited

U.S. PATENT DOCUMENTS 9,000,584 B2    4/2015    Lin et al.
9,048,222 B2    6/2015    Hung et al.
(Continued)

FOREIGN PATENT DOCUMENTS

CN    1588634 A    3/2005
CN    105374693 A    3/2016
(Continued)

*Primary Examiner* — Latanya N Crawford Eason
(74) *Attorney, Agent, or Firm* — Slater Matsil, LLP

(57) ABSTRACT

In an embodiment, a method includes: aligning a first package component with a second package component, the first package component having a first region and a second region, the first region including a first conductive connector, the second region including a second conductive connector; performing a first laser shot on a first portion of a top surface of the first package component, the first laser shot reflowing the first conductive connector of the first region, the first portion of the top surface of the first package component completely overlapping the first region; and after performing the first laser shot, performing a second laser shot on a second portion of the top surface of the first package component, the second laser shot reflowing the second conductive connector of the second region, the second portion of the top surface of the first package component completely overlapping the second region.

20 Claims, 19 Drawing Sheets

Related U.S. Application Data

(60) Provisional application No. 62/647,379, filed on Mar. 23, 2018.

(51) Int. Cl.
  *H01L 21/56* (2006.01)
  *H01L 21/683* (2006.01)
  *H01L 23/00* (2006.01)
  *H01L 23/31* (2006.01)
  *H01L 23/538* (2006.01)
  *H01L 25/10* (2006.01)

(52) U.S. Cl.
  CPC .......... *H01L 21/486* (2013.01); *H01L 21/568* (2013.01); *H01L 21/6835* (2013.01); *H01L 23/3128* (2013.01); *H01L 23/5384* (2013.01); *H01L 23/5389* (2013.01); *H01L 24/19* (2013.01); *H01L 24/20* (2013.01); *H01L 24/96* (2013.01); *H01L 25/105* (2013.01); *H01L 2221/68345* (2013.01); *H01L 2221/68359* (2013.01); *H01L 2221/68381* (2013.01); *H01L 2224/0231* (2013.01); *H01L 2224/02371* (2013.01); *H01L 2224/02379* (2013.01); *H01L 2224/211* (2013.01); *H01L 2225/1035* (2013.01); *H01L 2225/1058* (2013.01)

(58) Field of Classification Search
  CPC ............... H01L 23/5389; H01L 25/105; H01L 21/4857; H01L 21/4853; H01L 21/486; H01L 24/19; H01L 21/568; H01L 24/96; H01L 2225/1058
  See application file for complete search history.

(56) References Cited

U.S. PATENT DOCUMENTS

| | | |
|---|---|---|
| 9,048,233 B2 | 6/2015 | Wu et al. |
| 9,064,879 B2 | 6/2015 | Hung et al. |
| 9,111,949 B2 | 8/2015 | Yu et al. |
| 9,263,511 B2 | 2/2016 | Yu et al. |
| 9,281,254 B2 | 3/2016 | Yu et al. |
| 9,368,460 B2 | 6/2016 | Yu et al. |
| 9,372,206 B2 | 6/2016 | Wu et al. |
| 9,496,189 B2 | 11/2016 | Yu et al. |
| 9,543,170 B2 | 1/2017 | Yu et al. |
| 10,193,038 B2 | 1/2019 | Farrens et al. |
| 2003/0111449 A1* | 6/2003 | Sinkunas ............ H01R 43/0221 219/121.85 |
| 2003/0224581 A1 | 12/2003 | Lutz et al. |
| 2013/0070428 A1* | 3/2013 | Kangastupa .......... G02F 1/1345 361/728 |
| 2014/0193952 A1 | 7/2014 | Lin et al. |
| 2015/0357318 A1 | 12/2015 | Chen et al. |
| 2017/0250171 A1 | 8/2017 | Yu et al. |
| 2017/0301560 A1 | 10/2017 | Yoon et al. |
| 2019/0214362 A1* | 7/2019 | Lim ....................... H01L 24/75 |
| 2019/0279958 A1 | 9/2019 | Chen et al. |

FOREIGN PATENT DOCUMENTS

| | | |
|---|---|---|
| CN | 107123605 A | 9/2017 |
| CN | 107301965 A | 10/2017 |
| KR | 20170119271 A | 10/2017 |
| TW | 201608651 A | 3/2016 |
| TW | 201731054 A | 9/2017 |

* cited by examiner

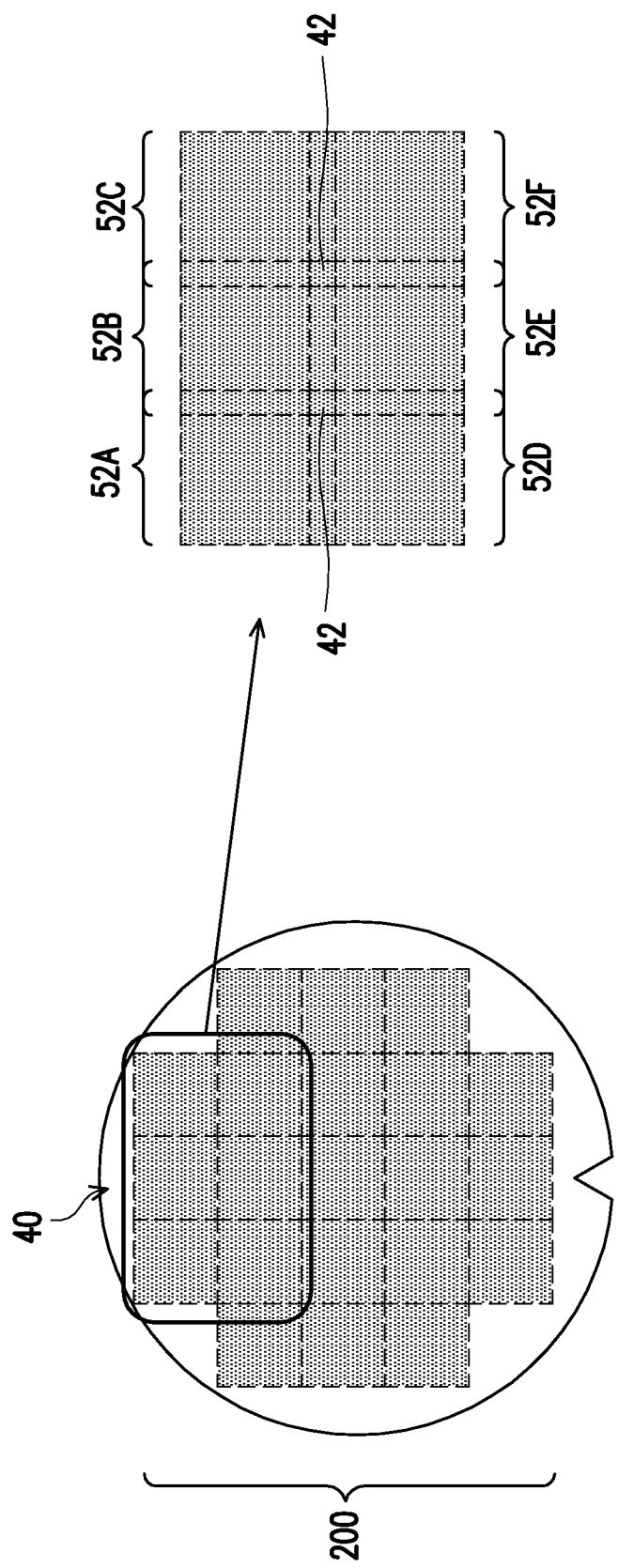

SEMICONDUCTOR PACKAGE AND METHOD

PRIORITY CLAIM AND CROSS-REFERENCE

This application is a continuation of U.S. patent application Ser. No. 16/148,465, filed on Oct. 1, 2018, entitled "Semiconductor Package and Method," which claims the benefit of U.S. Provisional Application No. 62/647,379, filed on Mar. 23, 2018, entitled "Wafer Bonding Method and Apparatus," which patent applications are incorporated herein by reference.

BACKGROUND

The semiconductor industry has experienced rapid growth due to ongoing improvements in the integration density of a variety of electronic components (e.g., transistors, diodes, resistors, capacitors, etc.). For the most part, improvement in integration density has resulted from iterative reduction of minimum feature size, which allows more components to be integrated into a given area. As the demand for shrinking electronic devices has grown, a need for smaller and more creative packaging techniques of semiconductor dies has emerged. An example of such packaging systems is Package-on-Package (PoP) technology. In a PoP device, a top semiconductor package is stacked on top of a bottom semiconductor package to provide a high level of integration and component density. PoP technology generally enables production of semiconductor devices with enhanced functionalities and small footprints on a printed circuit board (PCB).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1 through 19 are cross-sectional views of intermediate steps during a process for forming device packages, in accordance with some embodiments.

DETAILED DESCRIPTION

Figure 1:
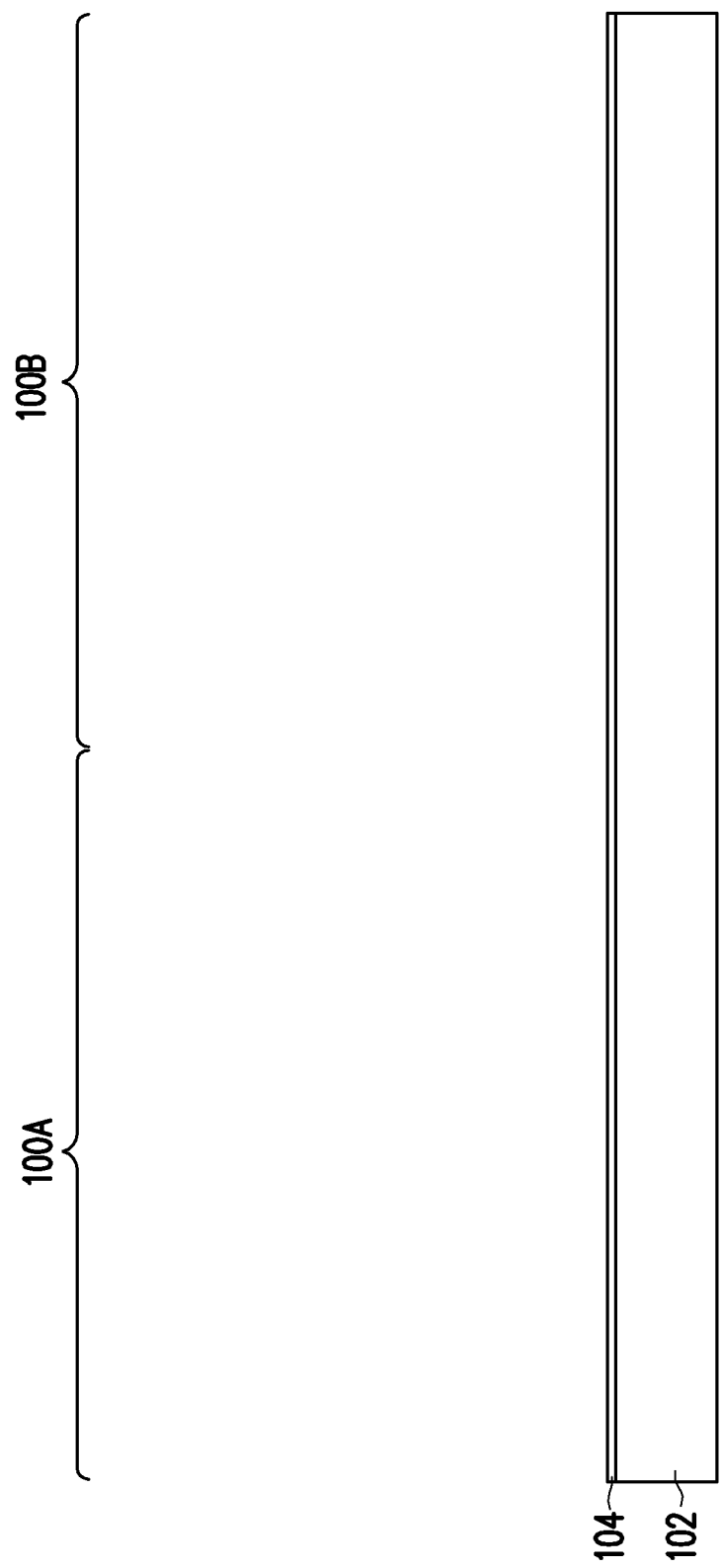

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

According to some embodiments, a first package component is bonded to a second package component by a multi-shot reflow process. The first and second package components may be, e.g., wafers, and each contain a plurality of package regions. In the multi-shot reflow process, the package regions of the package components are sequentially heated by a laser beam. Each laser shot completely overlaps at least one package region, and may partially overlap other adjacent package regions. The multi-shot reflow process allows the first and second package components to be bonded together by directly heating only the top package component. Indirect heating of the bottom package component may be reduced, which may help reduce wafer warpage. Further, the parameters of the different laser shots may be varied to help further reduce wafer warpage.

FIGS. 1 through 10 illustrate cross-sectional views of intermediate steps during a process for forming a first package component 100, in accordance with some embodiments. A first package region 100A and a second package region 100B are illustrated, and a first package 101 (see FIG. 19) is formed in each of the package regions 100A and 100B. The first packages 101 may also be referred to as integrated fan-out (InFO) packages.

In FIG. 1, a carrier substrate 102 is provided, and a release layer 104 is formed on the carrier substrate 102. The carrier substrate 102 may be a glass carrier substrate, a ceramic carrier substrate, or the like. The carrier substrate 102 may be a wafer, such that multiple packages can be formed on the carrier substrate 102 simultaneously. The release layer 104 may be formed of a polymer-based material, which may be removed along with the carrier substrate 102 from the overlying structures that will be formed in subsequent steps. In some embodiments, the release layer 104 is an epoxy-based thermal-release material, which loses its adhesive property when heated, such as a light-to-heat-conversion (LTHC) release coating. In other embodiments, the release layer 104 may be an ultra-violet (UV) glue, which loses its adhesive property when exposed to UV lights. The release layer 104 may be dispensed as a liquid and cured, may be a laminate film laminated onto the carrier substrate 102, or may be the like. The top surface of the release layer 104 may be leveled and may have a high degree of planarity.

Figure 2:
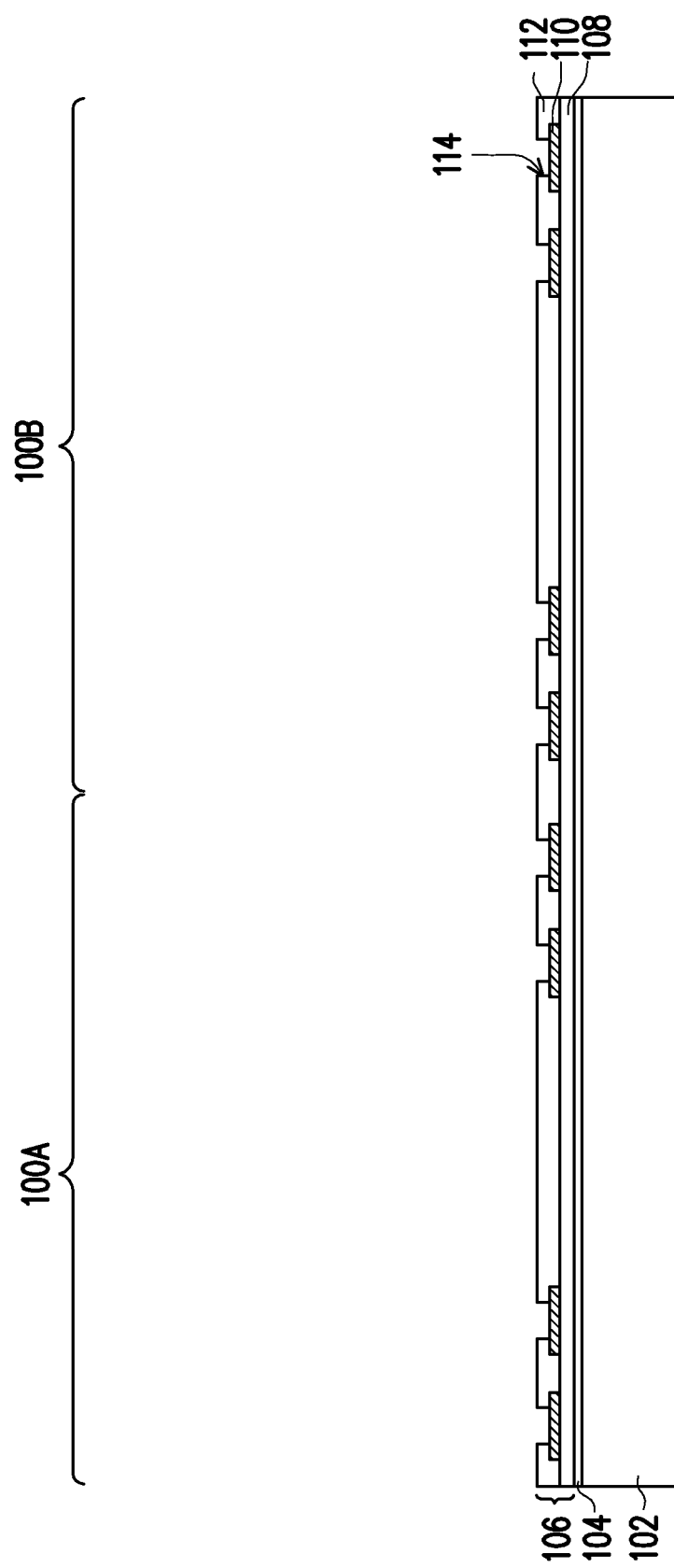

In FIG. 2, a back-side redistribution structure 106 is formed on the release layer 104. In the embodiment shown, the back-side redistribution structure 106 includes a dielectric layer 108, a metallization pattern 110 (sometimes referred to as redistribution layers or redistribution lines), and a dielectric layer 112. The back-side redistribution structure 106 is optional, and in some embodiments only the dielectric layer 108 is formed.

The dielectric layer 108 is formed on the release layer 104. The bottom surface of the dielectric layer 108 may be in contact with the top surface of the release layer 104. In some embodiments, the dielectric layer 108 is formed of a polymer, such as polybenzoxazole (PBO), polyimide, benzocyclobutene (BCB), or the like. In other embodiments, the dielectric layer 108 is formed of a nitride such as silicon nitride; an oxide such as silicon oxide, phosphosilicate glass (PSG), borosilicate glass (BSG), boron-doped phosphosilicate glass (BPSG), or the like; or the like. The dielectric layer 108 may be formed by any acceptable deposition process, such as spin coating, chemical vapor deposition (CVD), laminating, the like, or a combination thereof.

The metallization pattern 110 is formed on the dielectric layer 108. As an example to form metallization pattern 110, a seed layer is formed over the dielectric layer 108. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, physical vapor deposition (PVD) or the like. A photoresist is then formed and patterned on the seed layer. The photoresist may be formed by spin coating or the like and may be exposed to light for patterning. The pattern of the photoresist corresponds to the metallization pattern 110. The patterning forms openings through the photoresist to expose the seed layer. A conductive material is formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. Then, the photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching. The remaining portions of the seed layer and conductive material form the metallization pattern 110.

The dielectric layer 112 is formed on the metallization pattern 110 and the dielectric layer 108. In some embodiments, the dielectric layer 112 is formed of a polymer, which may be a photo-sensitive material such as PBO, polyimide, BCB, or the like, that may be patterned using a lithography mask. In other embodiments, the dielectric layer 112 is formed of a nitride such as silicon nitride; an oxide such as silicon oxide, PSG, BSG, BPSG; or the like. The dielectric layer 112 may be formed by spin coating, lamination, CVD, the like, or a combination thereof. The dielectric layer 112 is then patterned to form openings 114 exposing portions of the metallization pattern 110. The patterning may be by an acceptable process, such as by exposing the dielectric layer 112 to light when the dielectric layer 112 is a photo-sensitive material or by etching using, for example, an anisotropic etch.

It should be appreciated that the back-side redistribution structure 106 may include any number of dielectric layers and metallization patterns. Additional dielectric layers and metallization patterns may be formed by repeating the processes for forming the metallization pattern 110 and dielectric layer 112. The metallization patterns may include conductive lines and conductive vias. The conductive vias may be formed during the formation of the metallization pattern by forming the seed layer and conductive material of the metallization pattern in the opening of the underlying dielectric layer. The conductive vias may therefore interconnect and electrically couple the various conductive lines.

Figure 3:
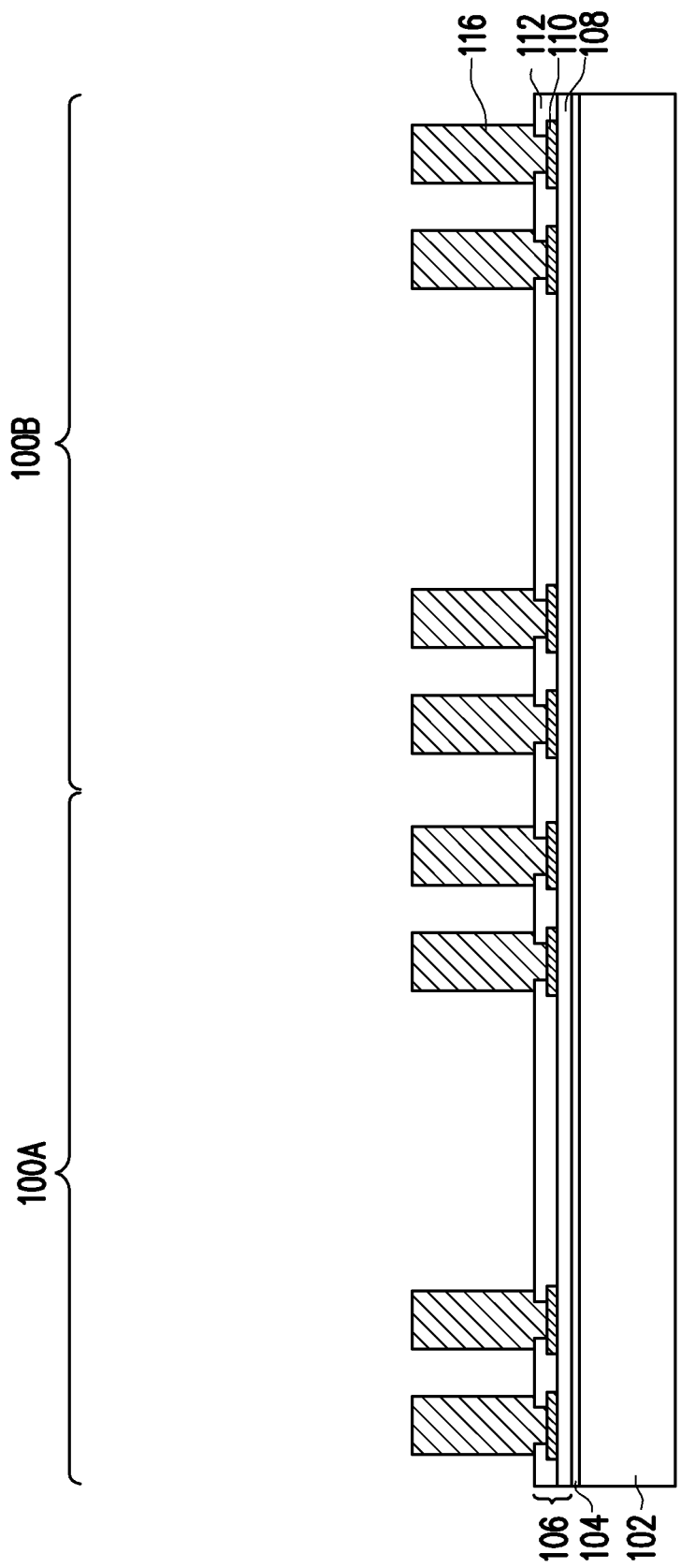

In FIG. 3, through vias 116 are formed in the openings 114 and extending away from the topmost dielectric layer of the back-side redistribution structure 106 (e.g., the dielectric layer 112 in the illustrated embodiment). As an example to form the through vias 116, a seed layer is formed over the back-side redistribution structure 106, e.g., on the dielectric layer 112 and portions of the metallization pattern 110 exposed by the openings 114. In some embodiments, the seed layer is a metal layer, which may be a single layer or a composite layer comprising a plurality of sub-layers formed of different materials. In a particular embodiment, the seed layer comprises a titanium layer and a copper layer over the titanium layer. The seed layer may be formed using, for example, PVD or the like. A photoresist is formed and patterned on the seed layer. The photoresist may be formed by spin coating or the like and may be exposed to light for patterning. The pattern of the photoresist corresponds to conductive vias. The patterning forms openings through the photoresist to expose the seed layer. A conductive material is formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. The photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching. The remaining portions of the seed layer and conductive material form the through vias 116.

Figure 4:
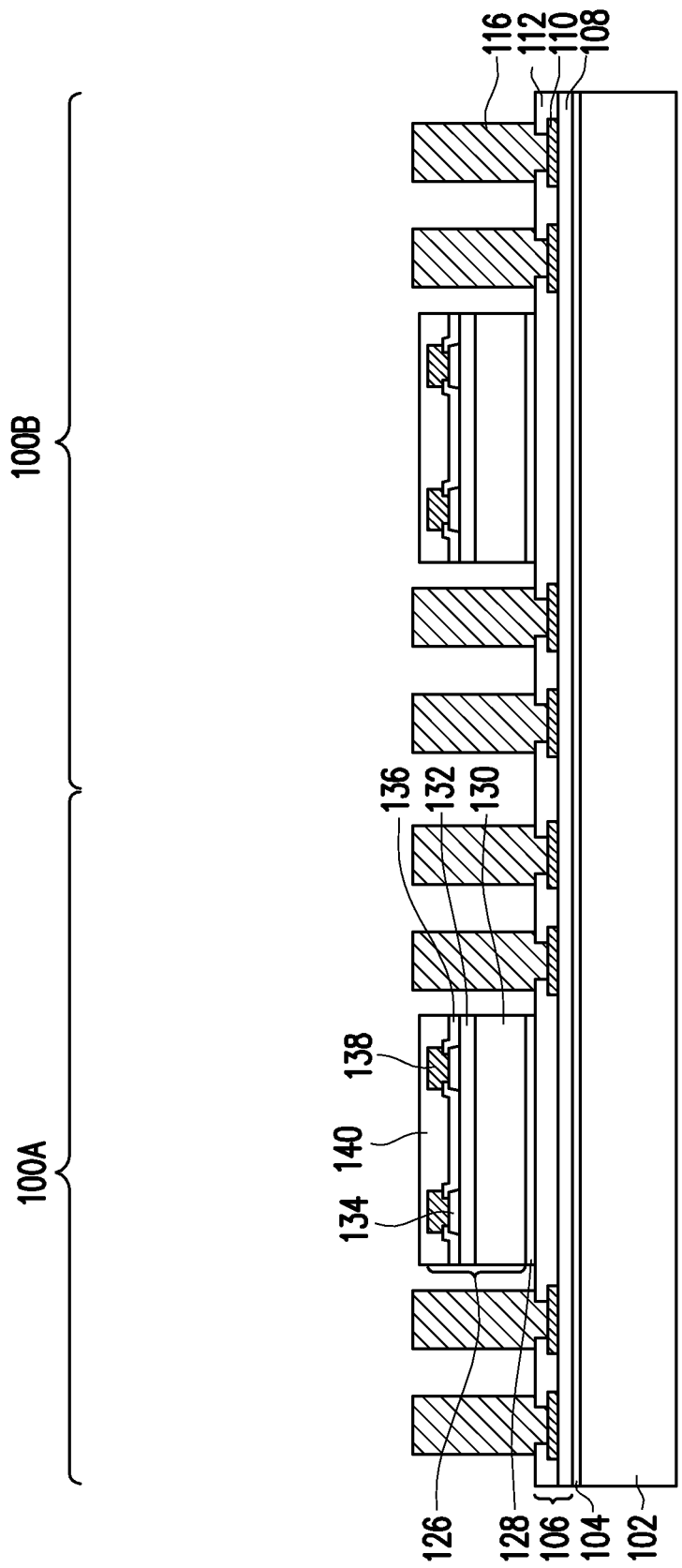

In FIG. 4, integrated circuit dies 126 are adhered to the dielectric layer 112 by an adhesive 128. The integrated circuit dies 126 may be logic dies (e.g., central processing unit, microcontroller, etc.), memory dies (e.g., dynamic random access memory (DRAM) die, static random access memory (SRAM) die, etc.), power management dies (e.g., power management integrated circuit (PMIC) die), radio frequency (RF) dies, sensor dies, micro-electro-mechanical-system (MEMS) dies, signal processing dies (e.g., digital signal processing (DSP) die), front-end dies (e.g., analog front-end (AFE) dies), the like, or a combination thereof. Also, in some embodiments, the integrated circuit dies 126 may be different sizes (e.g., different heights and/or surface areas), and in other embodiments, the integrated circuit dies 126 may be the same size (e.g., same heights and/or surface areas).

Before being adhered to the dielectric layer 112, the integrated circuit dies 126 may be processed according to applicable manufacturing processes to form integrated circuits in the integrated circuit dies 126. For example, the integrated circuit dies 126 each include a semiconductor substrate 130, such as silicon, doped or undoped, or an active layer of a semiconductor-on-insulator (SOI) substrate. The semiconductor substrate may include other semiconductor materials, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. Devices, such as transistors, diodes, capacitors, resistors, etc., may be formed in and/or on the semiconductor substrate 130 and may be interconnected by interconnect structures 132 formed by, for example, metallization patterns in one or more dielectric layers on the semiconductor substrate 130 to form an integrated circuit.

The integrated circuit dies 126 further comprise pads 134, such as aluminum pads, to which external connections are made. The pads 134 are on what may be referred to as respective active sides of the integrated circuit dies 126. Passivation films 136 are on the integrated circuit dies 126 and on portions of the pads 134. Openings extend through the passivation films 136 to the pads 134. Die connectors 138, such as conductive pillars (for example, comprising a metal such as copper), extend through the openings in the passivation films 136 and are mechanically and electrically coupled to the respective pads 134. The die connectors 138 may be formed by, for example, plating, or the like. The die connectors 138 electrically couple the respective integrated circuits of the integrated circuit dies 126.

A dielectric material 140 is on the active sides of the integrated circuit dies 126, such as on the passivation films 136 and the die connectors 138. The dielectric material 140 laterally encapsulates the die connectors 138, and the dielectric material 140 is laterally coterminous with the respective integrated circuit dies 126. The dielectric material 140 may be a polymer such as PBO, polyimide, BCB, or the like; a nitride such as silicon nitride or the like; an oxide such as silicon oxide, PSG, BSG, BPSG, or the like; the like, or a combination thereof, and may be formed, for example, by spin coating, lamination, CVD, or the like.

The adhesive 128 is on back-sides of the integrated circuit dies 126 and adheres the integrated circuit dies 126 to the back-side redistribution structure 106, such as the dielectric layer 112. The adhesive 128 may be any suitable adhesive, epoxy, die attach film (DAF), or the like. The adhesive 128 may be applied to a back-side of the integrated circuit dies 126 or may be applied over the surface of the carrier substrate 102. For example, the adhesive 128 may be applied to the back-side of the integrated circuit dies 126 before singulating to separate the integrated circuit dies 126.

Although one integrated circuit die 126 is illustrated as being adhered in each of the first package region 100A and the second package region 100B, it should be appreciated that more integrated circuit dies 126 may be adhered in each package region. For example, multiple integrated circuit dies 126 may be adhered in each region. Further, the integrated circuit dies 126 may vary in size. In some embodiments, the integrated circuit die 126 may be dies with a large footprint, such as system-on-chip (SoC) devices. In embodiments where the integrated circuit die 126 have a large footprint, the space available for the through vias 116 in the package regions may be limited. Use of the back-side redistribution structure 106 allows for an improved interconnect arrangement when the package regions have limited space available for the through vias 116.

Figure 5:
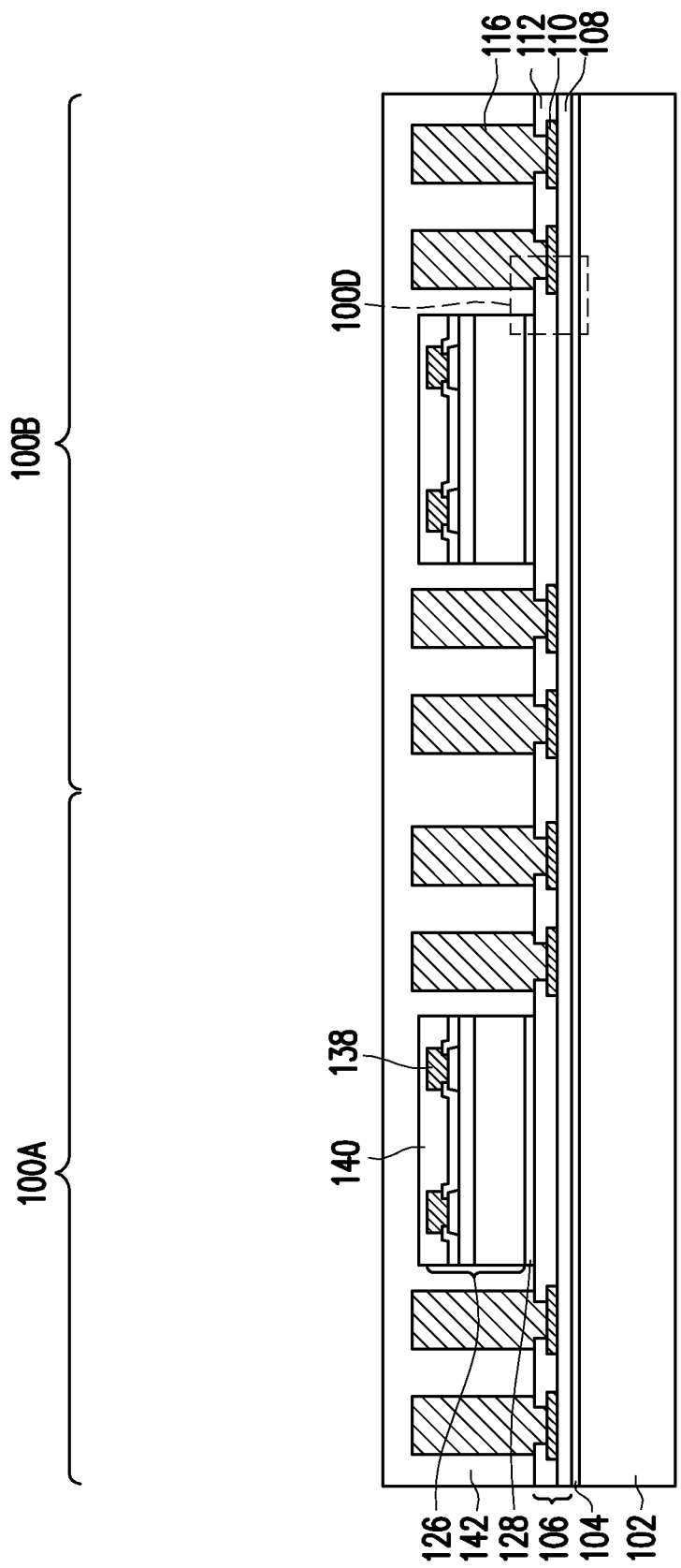

In FIG. 5, an encapsulant 142 is formed on the various components. After formation, the encapsulant 142 laterally encapsulates the through vias 116 and integrated circuit dies 126. The encapsulant 142 may be a molding compound, epoxy, or the like. The encapsulant 142 may be applied by compression molding, transfer molding, or the like, and may be formed over the carrier substrate 102 such that the through vias 116 and/or the integrated circuit dies 126 are buried or covered. The encapsulant 142 is then cured.

Figure 6:
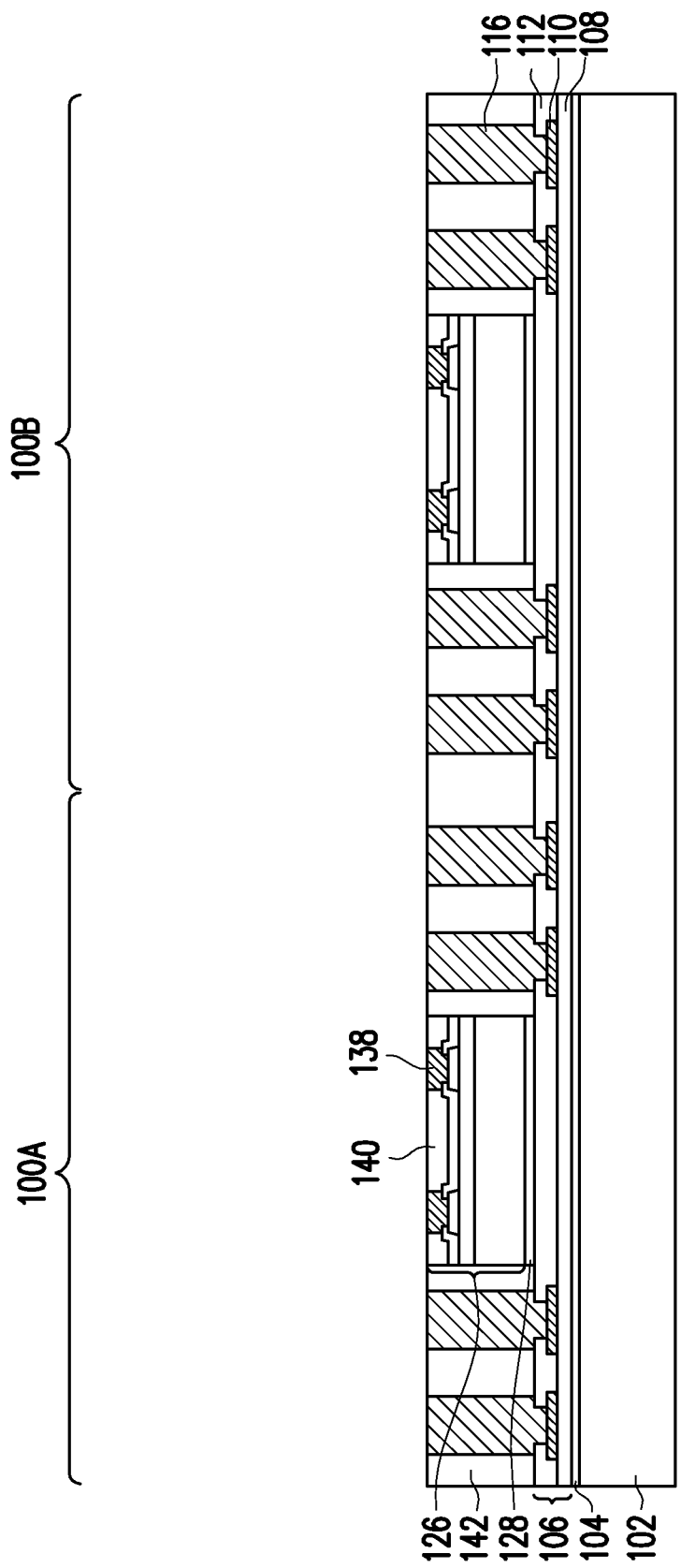

In FIG. 6, a planarization process is performed on the encapsulant 142 to expose the through vias 116 and the die connectors 138. The planarization process may also grind the dielectric material 140. Top surfaces of the through vias 116, die connectors 138, dielectric material 140, and encapsulant 142 are coplanar after the planarization process. The planarization process may be, for example, a chemical-mechanical polish (CMP), a grinding process, or the like. In some embodiments, the planarization may be omitted, for example, if the through vias 116 and die connectors 138 are already exposed.

Figure 7:
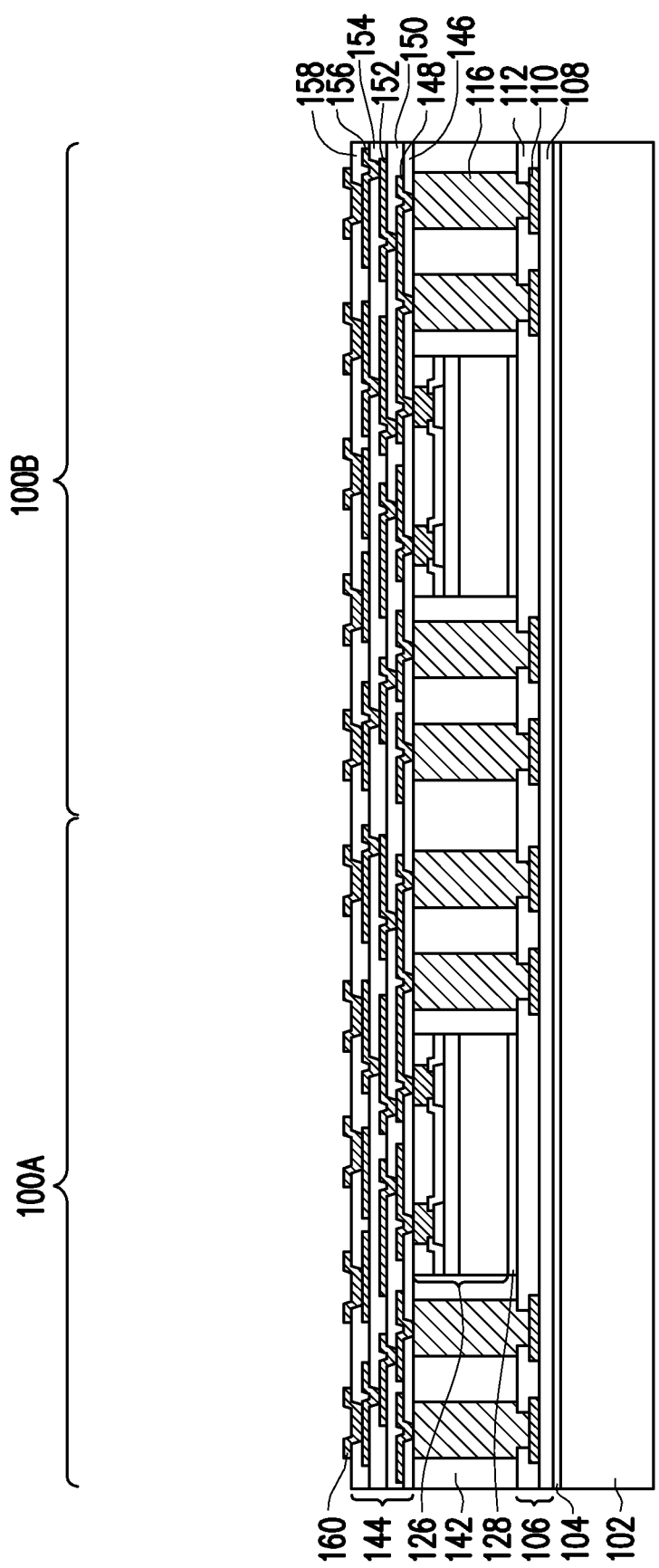

In FIG. 7, a front-side redistribution structure 144 is formed over the through vias 116, encapsulant 142, and integrated circuit dies 126. The front-side redistribution structure 144 includes dielectric layers 146, 150, 154, and 158; metallization patterns 148, 152, and 156; and under bump metallurgies (UBMs) 160. The metallization patterns may also be referred to as redistribution layers or redistribution lines. The front-side redistribution structure 144 is shown as an example. More or fewer dielectric layers and metallization patterns may be formed in the front-side redistribution structure 144. If fewer dielectric layers and metallization patterns are to be formed, steps and process discussed below may be omitted. If more dielectric layers and metallization patterns are to be formed, steps and processes discussed below may be repeated.

As an example to form the front-side redistribution structure 144, the dielectric layer 146 is deposited on the encapsulant 142, through vias 116, and die connectors 138. In some embodiments, the dielectric layer 146 is formed of a photo-sensitive material such as PBO, polyimide, BCB, or the like, which may be patterned using a lithography mask. The dielectric layer 146 may be formed by spin coating, lamination, CVD, the like, or a combination thereof. The dielectric layer 146 is then patterned. The patterning forms openings exposing portions of the through vias 116 and the die connectors 138. The patterning may be by an acceptable process, such as by exposing the dielectric layer 146 to light when the dielectric layer 146 is a photo-sensitive material or by etching using, for example, an anisotropic etch. If the dielectric layer 146 is a photo-sensitive material, the dielectric layer 146 can be developed after the exposure.

The metallization pattern 148 is then formed. The metallization pattern 148 includes conductive lines on and extending along the major surface of the dielectric layer 146. The metallization pattern 148 further includes conductive vias extending through the dielectric layer 146 to be physically and electrically connected to the through vias 116 and the integrated circuit dies 126. To form the metallization pattern 148, a seed layer is formed over the dielectric layer 146 and in the openings extending through the dielectric layer 146. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photo resist is then formed and patterned on the seed layer. The photo resist may be formed by spin coating or the like and may be exposed to light for patterning. The pattern of the photo resist corresponds to the metallization pattern 148. The patterning forms openings through the photo resist to expose the seed layer. A conductive material is then formed in the openings of the photo resist and on the exposed portions of the seed layer. The conductive material may be formed by plating, such as electroplating or electroless plating, or the like. The conductive material may comprise a metal, like copper, titanium, tungsten, aluminum, or the like. The combination of the conductive material and underlying portions of the seed layer form the metallization pattern 148. The photo resist and portions of the seed layer on which the conductive material is not formed are removed. The photo resist may be removed by an acceptable ashing or stripping process, such as using an oxygen plasma or the like. Once the photo resist is removed, exposed portions of the seed layer are removed, such as by using an acceptable etching process, such as by wet or dry etching.

The dielectric layer 150 is deposited on the metallization pattern 148 and dielectric layer 146. The dielectric layer 150 may be formed in a manner similar to the dielectric layer 146, and may be formed of the same material as the dielectric layer 146.

The metallization pattern 152 is then formed. The metallization pattern 152 includes conductive lines on and extending along the major surface of the dielectric layer 150. The metallization pattern 152 further includes conductive vias extending through the dielectric layer 150 to be physically and electrically connected to the metallization pattern 148. The metallization pattern 152 may be formed in a manner similar to the metallization pattern 148, and may be formed of the same material as the metallization pattern 148.

The dielectric layer 154 is deposited on the metallization pattern 152 and dielectric layer 150. The dielectric layer 154 may be formed in a manner similar to the dielectric layer 146, and may be formed of the same material as the dielectric layer 146.

The metallization pattern 156 is then formed. The metallization pattern 156 includes conductive lines on and extending along the major surface of the dielectric layer 154. The metallization pattern 156 further includes conductive vias extending through the dielectric layer 154 to be physically and electrically connected to the metallization pattern 152. The metallization pattern 156 may be formed in a manner similar to the metallization pattern 148, and may be formed of the same material as the metallization pattern 148.

The dielectric layer 158 is deposited on the metallization pattern 156 and dielectric layer 154. The dielectric layer 158 may be formed in a manner similar to the dielectric layer 146, and may be formed of the same material as the dielectric layer 146.

The UBMs 160 are optionally formed on and extending through the dielectric layer 158. As an example to form the UBMs 160, the dielectric layer 158 may be patterned to form openings exposing portions of the metallization pattern 156. The patterning may be by an acceptable process, such as by exposing the dielectric layer 158 to light when the dielectric layer 158 is a photo-sensitive material or by etching using, for example, an anisotropic etch. If the dielectric layer 158 is a photo-sensitive material, the dielectric layer 158 can be developed after the exposure. The openings for the UBMs 160 may be wider than the openings for the conductive via portions of the metallization patterns 148, 152, and 156. A seed layer is formed over the dielectric layer 158 and in the openings. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photoresist is then formed and patterned on the seed layer. The photoresist may be formed by spin coating or the like and may be exposed to light for patterning. The pattern of the photoresist corresponds to the UBMs 160. The patterning forms openings through the photoresist to expose the seed layer. A conductive material is formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. Then, the photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching. The remaining portions of the seed layer and conductive material form the UBMs 160. In embodiments where the UBMs 160 are formed differently, more photoresist and patterning steps may be utilized.

Figure 8:
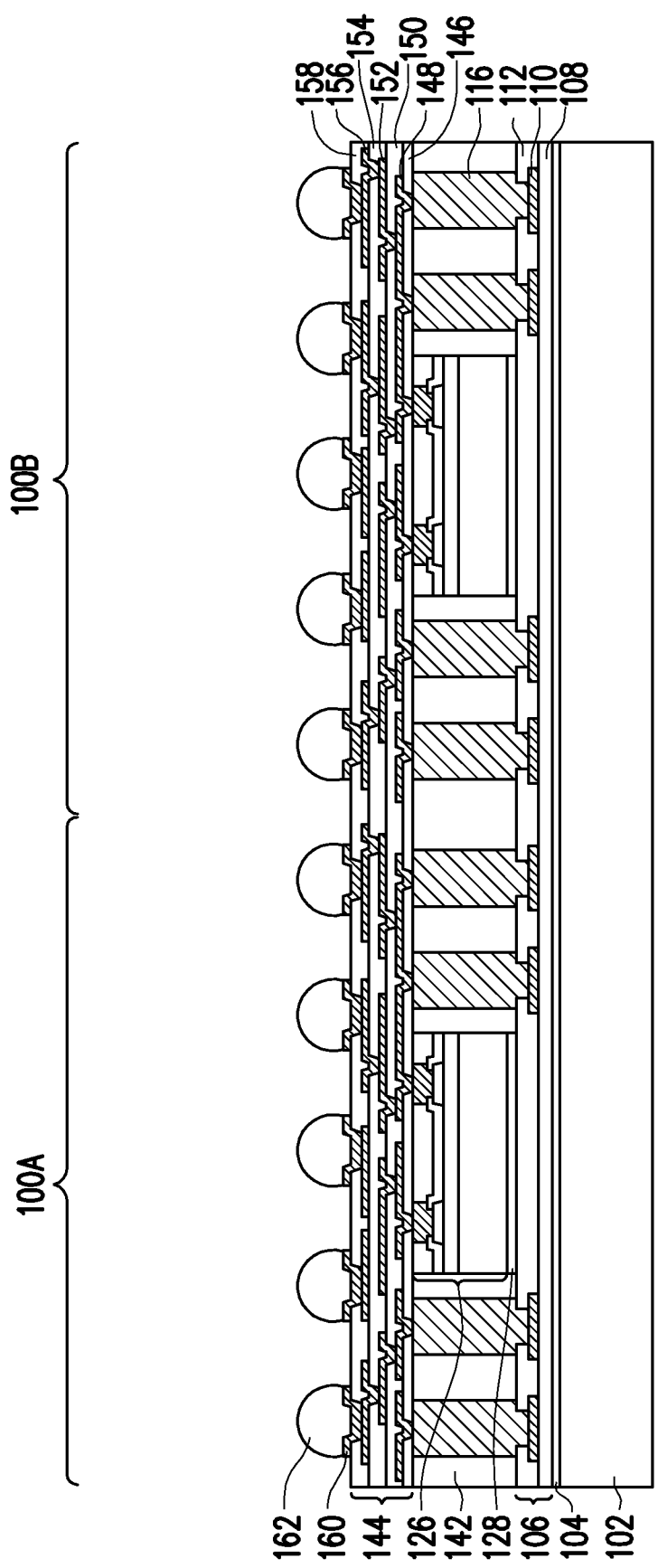

In FIG. 8, conductive connectors 162 are formed on the UBMs 160. The conductive connectors 162 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 162 may include a conductive material such as solder, copper, aluminum, gold, nickel, silver, palladium, tin, the like, or a combination thereof. In some embodiments, the conductive connectors 162 are formed by initially forming a layer of solder through such commonly used methods such as evaporation, electroplating, printing, solder transfer, ball placement, or the like. Once a layer of solder has been formed on the structure, a reflow may be performed in order to shape the material into the desired bump shapes. In another embodiment, the conductive connectors 162 comprise metal pillars (such as a copper pillar) formed by a sputtering, printing, electro plating, electroless plating, CVD, or the like. The metal pillars may be solder free and have substantially vertical sidewalls. In some embodiments, a metal cap layer is formed on the top of the metal pillars. The metal cap layer may include nickel, tin, tin-lead, gold, silver, palladium, indium, nickel-palladium-gold, nickel-gold, the like, or a combination thereof and may be formed by a plating process.

Figure 9:
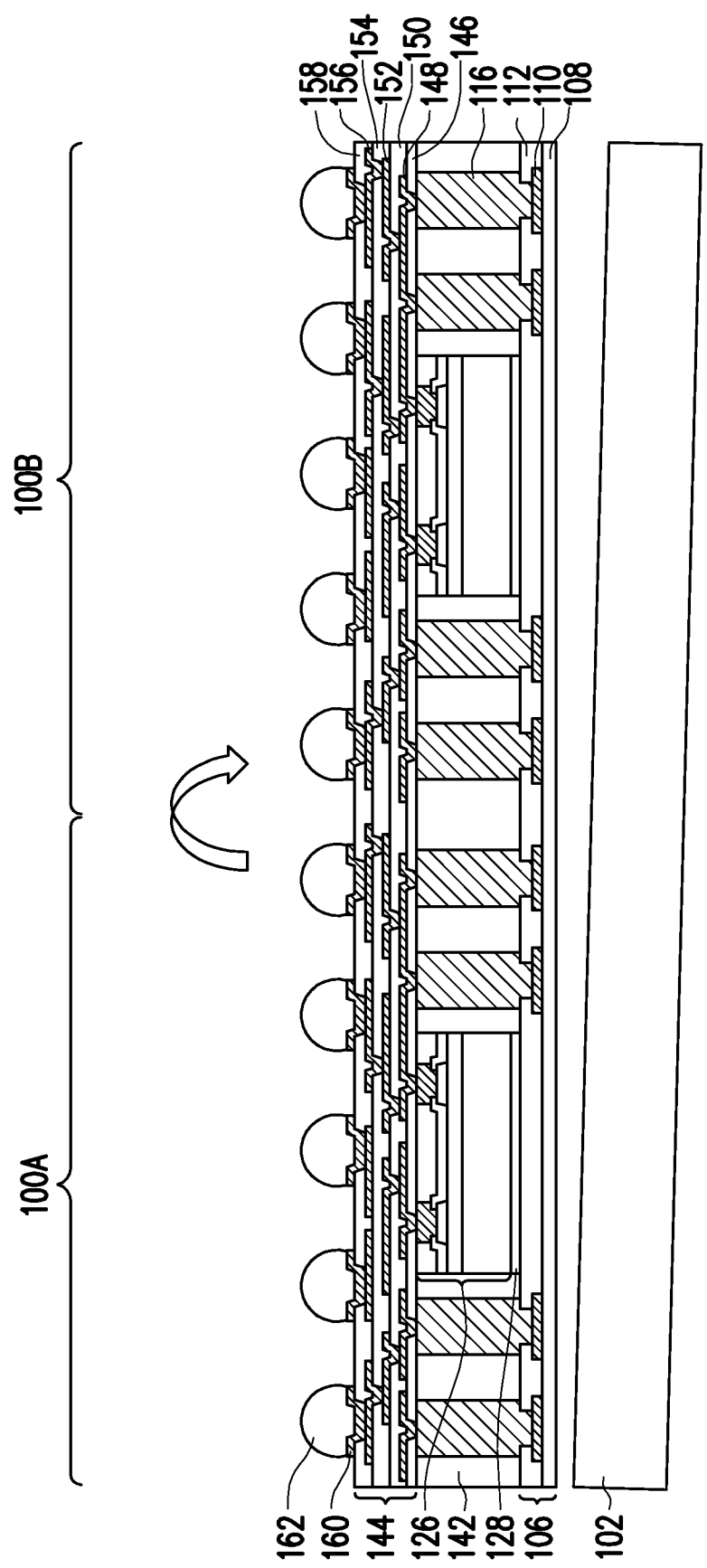

In FIG. 9, a carrier substrate de-bonding is performed to detach (or "de-bond") the carrier substrate 102 from the back-side redistribution structure 106, e.g., the dielectric layer 108. In accordance with some embodiments, the de-bonding includes projecting a light such as a laser light or an UV light on the release layer 104 so that the release layer 104 decomposes under the heat of the light and the carrier substrate 102 can be removed. The structure is then flipped over and placed on a tape.

Figure 10:
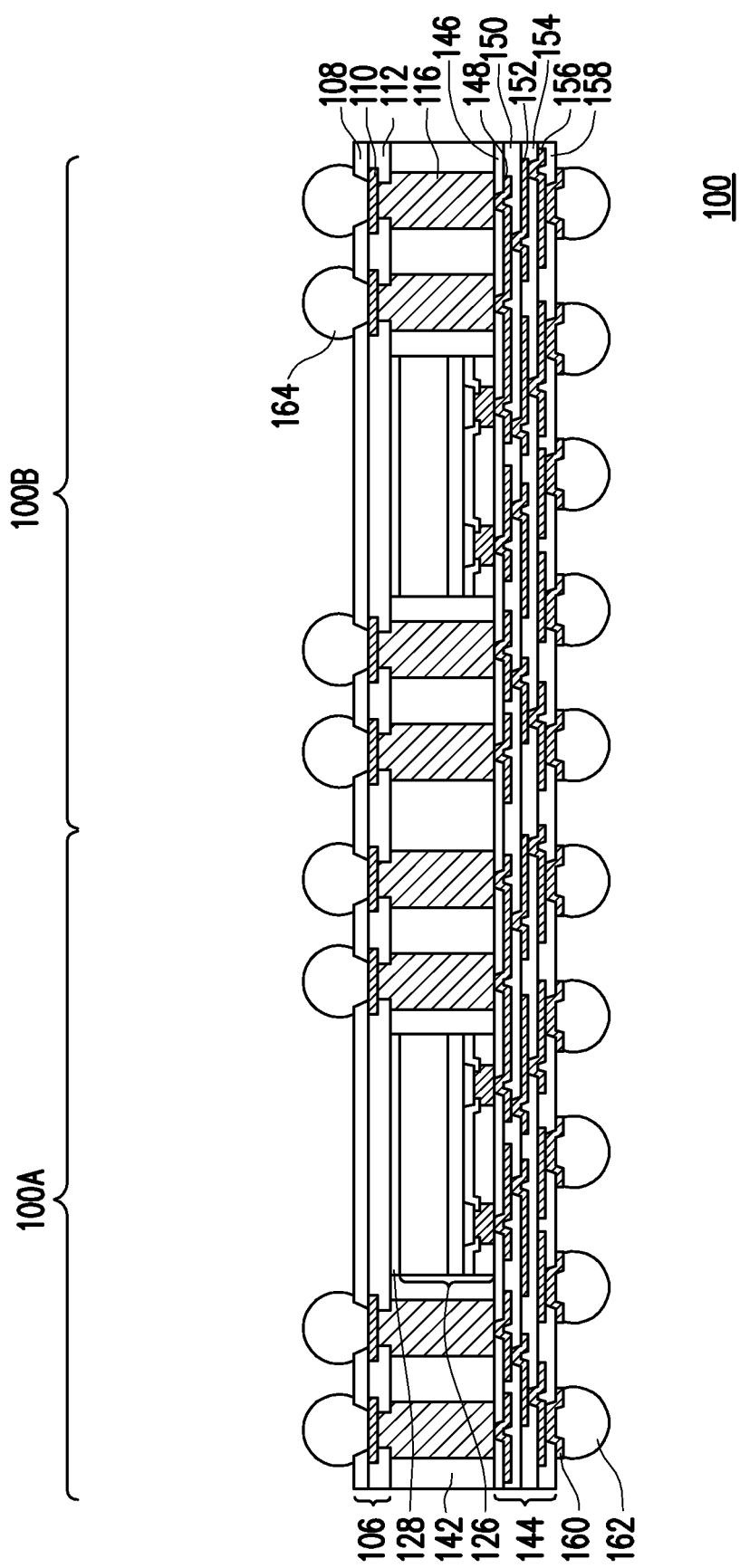

In FIG. 10, conductive connectors 164 are formed extending through the dielectric layer 108 to contact the metallization pattern 110. Openings are formed through the dielectric layer 108 to expose portions of the metallization pattern 110. The openings may be formed, for example, using laser drilling, etching, or the like. The conductive connectors 164 are formed in the openings. In some embodiments, the conductive connectors 164 comprise flux and are formed in a flux dipping process. In some embodiments, the conductive connectors 164 comprise a conductive paste such as solder paste, silver paste, or the like, and are dispensed in a printing process. In some embodiments, the conductive connectors 164 are formed in a manner similar to the conductive connectors 162, and may be formed of the same material as the conductive connectors 162.

FIGS. 11 through 18 illustrate cross-sectional views of intermediate steps during a process for bonding the first package component 100 to a second package component 200, in accordance with some embodiments. A first package region 200A and a second package region 200B are illustrated, and a second package 201 (see FIG. 19) is formed in each of the package regions 200A and 200B.

Figure 11:
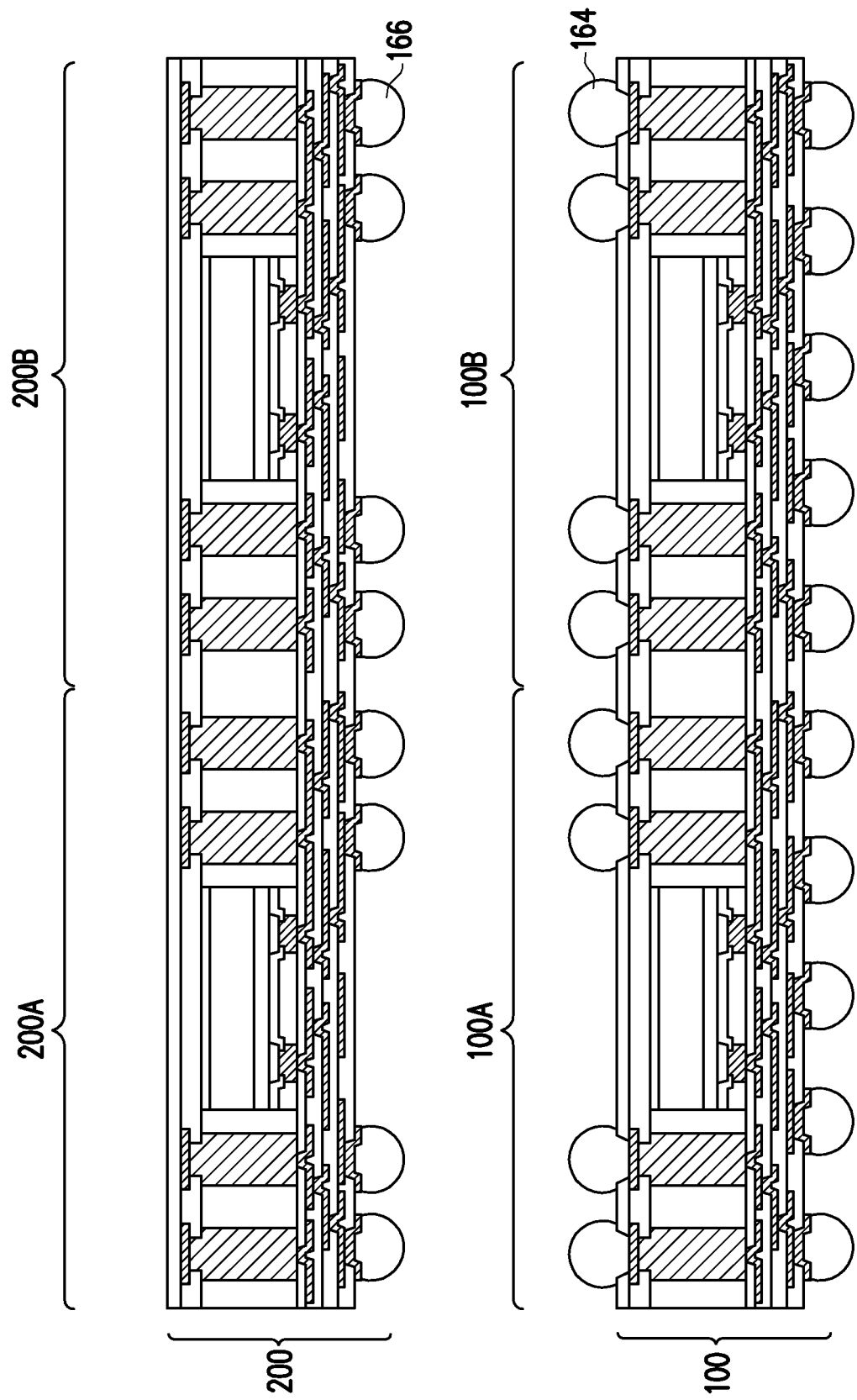

In FIG. 11, the second package component 200 is provided or produced. In the embodiment shown, the same types of packages are formed in the package components 100 and 200. In some embodiments, different types of packages are formed in the package components 100 and 200. In the embodiment shown, the package components 100 and 200 are both InFO packages. The second package component 200 has conductive connectors 166, which are similar to the conductive connectors 162 of the first package component 100.

Figure 12:
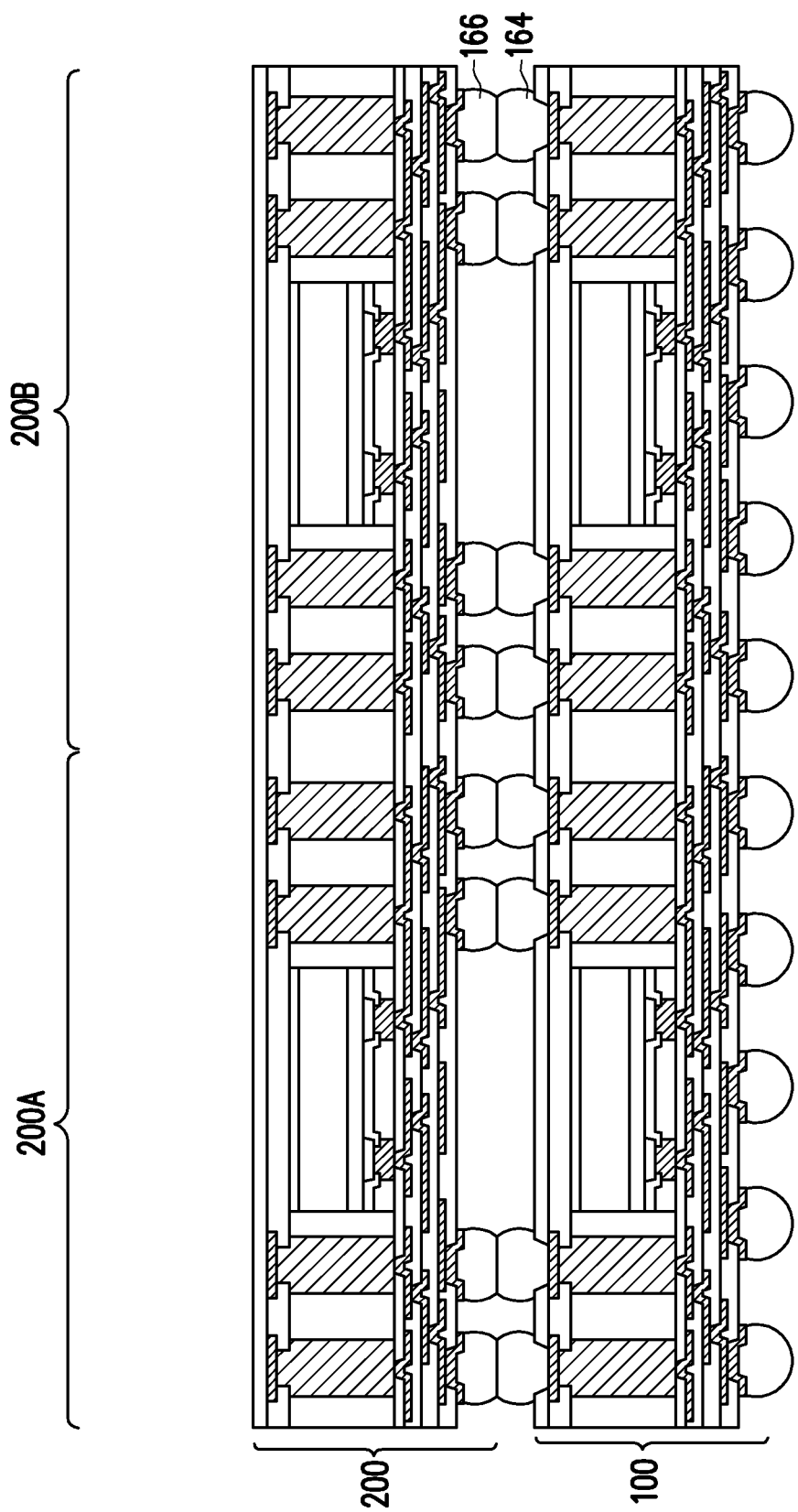

In FIG. 12, the second package component 200 is aligned with the first package component 100. Respective package regions of each of the package components 100 and 200 are aligned. For example, the first package regions 100A and 200A are aligned, and the second package regions 100B and 200B are aligned. The package components 100 and 200 are pressed together such that the conductive connectors 166 of the second package component 200 contact the conductive connectors 164 of the first package component 100.

FIGS. 13 through 18 illustrate a reflow process, which includes a plurality of laser shots and hence a plurality of reflow processes. The reflow process shown in FIGS. 13 through 18 is thus referred to as a multi-shot reflow process. The plurality of laser shots are performed using a laser beam 52, which is generated by a laser beam generator 54. In each of the laser shots, the laser beam 52 is projected on one region of the top surface of the second package component 200, so that heat is absorbed by the second package component 200 and conducted through the second package component 200 to the conductive connectors 164 and 166, causing the reflow of the conductive connectors 164 and 166 to form conductive connectors 168. The laser beam generator 54 is configured to generate the laser beam 52, and the laser beam 52 is emitted out of an emitter of the laser beam generator 54. The laser beam 52 is larger than a typical laser beam. For example, the laser beam 52 may have a size in the range of from about 0.03×0.03 mm$^2$ to about 100×100 mm$^2$. For example, the laser beam generator 54 is configured to enlarge a small laser beam to a desirable larger size. Furthermore, as illustrated in FIGS. 15, 16, 17A, 17B, and 17C, the laser beam 52 may cover a rectangular region. The power of different portions of the laser beam 52 is substantially uniform, for example, with a variation smaller than about 10 percent throughout the rectangular region. In each of the laser shots, the conductive connectors 164 and 166 covered by the laser beam 52 are reflowed substantially simultaneously.

Figure 13:
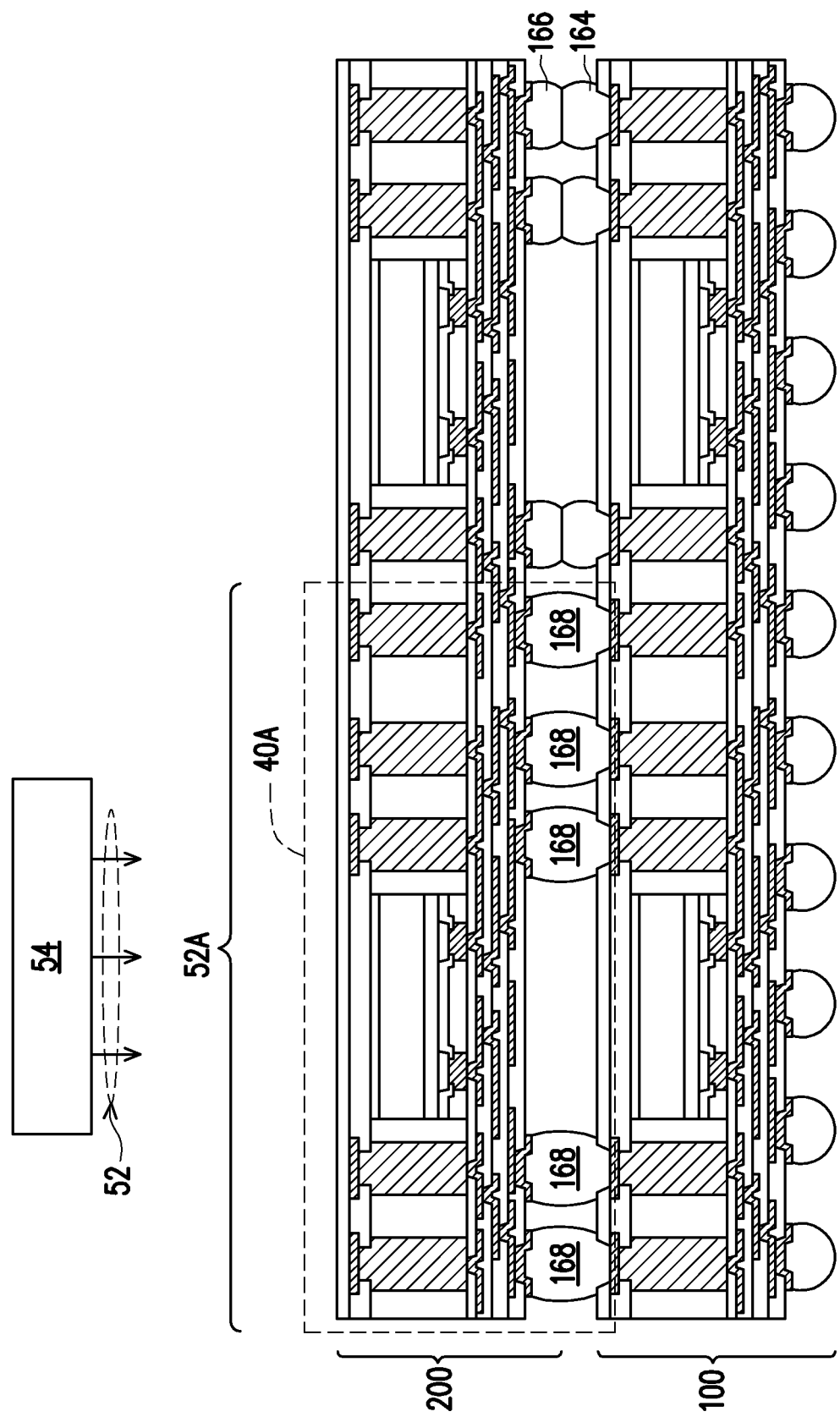

In FIG. 13, a first laser shot 52A is performed at a first region 40A of the second package component 200. The first region 40A includes components of the package components 100 and 200 which are directly in the projecting path of the first laser shot 52A. In accordance with some embodiments, the first region 40A completely overlaps the first package region 200A (see FIG. 12), and is larger than the first package region 200A. For example, the first region 40A also partially overlaps the second package region 200B. When the laser beam 52 is projected on the first region 40A of the second package component 200, the first region 40A is heated, and the heat is transferred to the conductive connectors 164 and 166 directly under the first region 40A. The first laser shot 52A is performed until the conductive connectors 164 and 166 in the first region 40A are molten and reflowed to form conductive connectors 168. The conductive connectors 164 and 166 outside of the first region 40A (e.g., not in the projecting path of laser beam 52) are heated less than the conductive connectors 164 and 166 inside of the first region 40A, and are not reflowed. The duration and the unit power (e.g., the power per unit area) of the first laser shot 52A is controlled such that a majority of the conductive connectors 164 and 166 outside of the first region 40A are not molten and hence are not reflowed. Accordingly, the duration of the first laser shot 52A is long enough to melt the conductive connectors 164 and 166 inside of the first region 40A, and short enough so that at least the majority of (or all of) of the conductive connectors 164 and 166 outside of the first region 40A are not molten. A small number of conductive connectors 164 and 166 that are outside of and close to the first region 40A may also be molten, for example, due to process variations or increased process margins. The unit power of the laser beam 52 is also selected to be high enough to melt the conductive connectors 164 and 166 inside of the first region 40A, and low enough so that the conductive connectors 164 and 166 outside of the first region 40A are not molten. In some embodiments, the duration of the laser shot is in the range of from about 2 seconds to about 30 seconds. The unit power may be in the range of from about 0.1 watts/mm$^2$ to about 0.7 watts/mm$^2$. It should be appreciated that the length of time and unit power needed to melt the conductive connectors 164 and 166 is affected by a plurality of factors, which factors may include the unit power, the shot duration, the thickness of the second package component 200, the materials and the thermal conductivity of the second package component 200, and the like. In some embodiments, the conductive connectors 164 and 166 have a melting temperature higher than about 200° C., and may be in the range of from about 215° C. to about 230° C. The unit power of the laser shot may be adjusted to obtain a particular heating rate and peak temperature. In an embodiment, the peak temperature is in a range of from about 240° C. to about 250° C., and the heating rate is in a range of from about 0.5° C./second to about 50° C./second. After the conductive connectors 164 and 166 inside the first region 40A are molten, and before the conductive connectors 164 and 166 outside the first region 40A are molten, the first laser shot is ended.

After the first laser shot 52A, the laser beam 52 is turned off, and is stopped from being projected on the second package component 200. Between the ending time of the first laser shot 52A and the starting time of a second laser shot 52B (see FIG. 14), a delay time may be implemented. During the delay, no laser shots are performed. The delay is long enough so that the reflowed conductive connectors 168 cool down and solidify. For example, the temperature of the conductive connectors 168 may drop into the range of from about 100° C. to about 150° C. after the delay time. The delay time may be in the range of from about 5 seconds to about 30 seconds. In some embodiments, cooling of the conductive connectors 168 is performed, such as air cooling. In such embodiments, the delay time may be adjusted to obtain a particular cooling rate. In some embodiments, the delay time is a predetermined period of time. In an embodiment, the cooling rate is greater than about 1° C./second.

Figure 14:
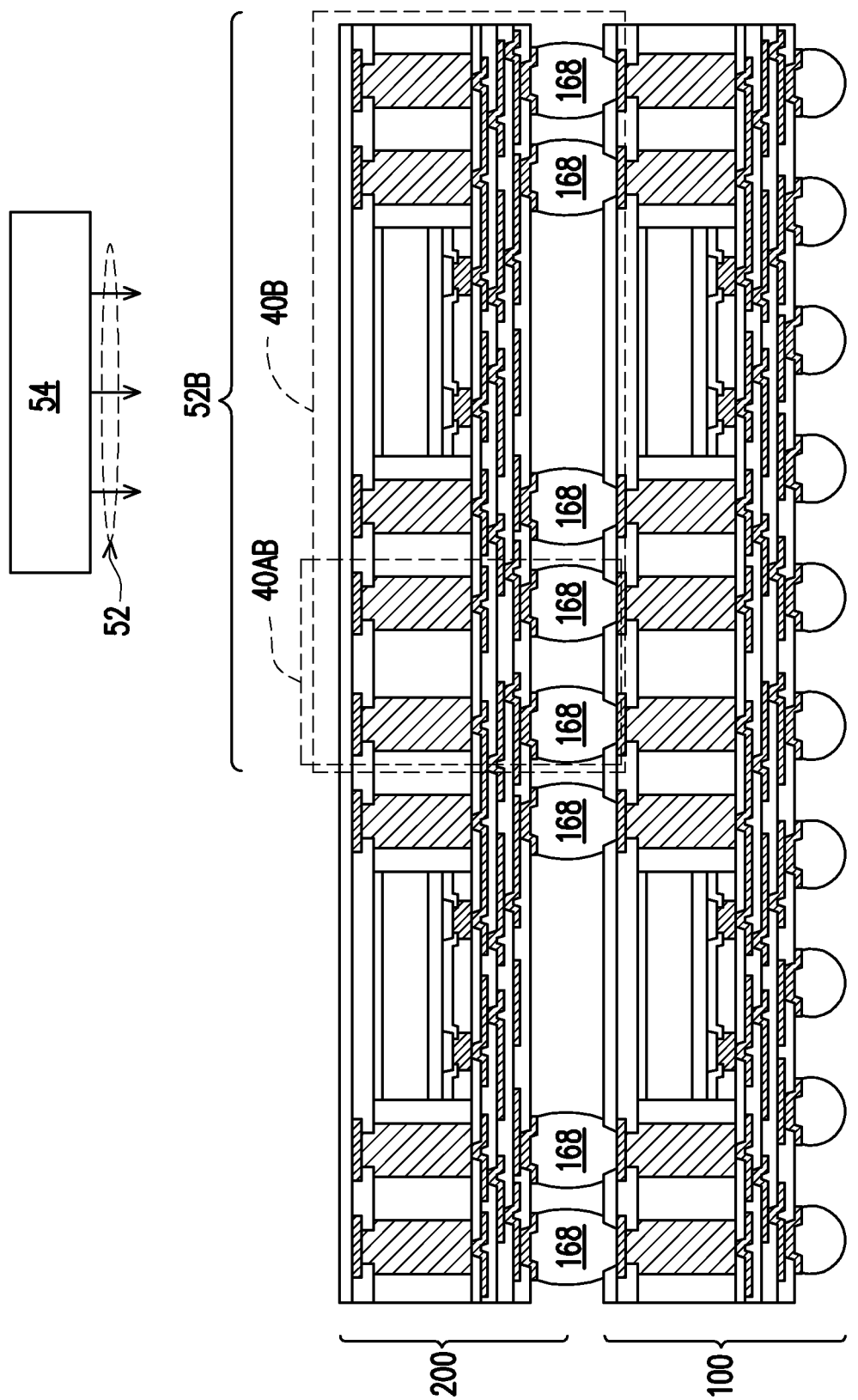

In FIG. 14, a second laser shot 52B is performed at a second region 40B of the second package component 200. The second region 40B includes components of the package components 100 and 200 which are directly in the projecting path of the second laser shot 52B. As a result, the conductive connectors 164 and 166 in the second region 40B are reflowed. Most or all of the conductive connectors 164 and 166 outside of the second region 40B do not receive adequate heat, and are not molten and not reflowed. A small number of conductive connectors 164 and 166 that are outside of and close to the second region 40B may also be molten, for example, due to process variations or increased process margins. In some embodiments, the regions 40A and 40B overlap in an overlap region 40AB. Some of the resulting conductive connectors 168 are disposed in the overlap region 40AB. The conductive connectors 168 in the overlap region 40AB are reflowed twice: once during the first laser shot 52A, and once during the second laser shot 52B. Other conductive connectors 168 outside of the overlap region 40AB are reflowed once. Overlapping the regions 40A and 40B ensures that an entirety of the package regions 200A and 200B (see FIG. 12) are covered by the multiple laser shots, even when there are process variations such as misalignment in one of the laser shots. As such, all of the conductive connectors 164 and 166 will be reflowed.

Figure 15:
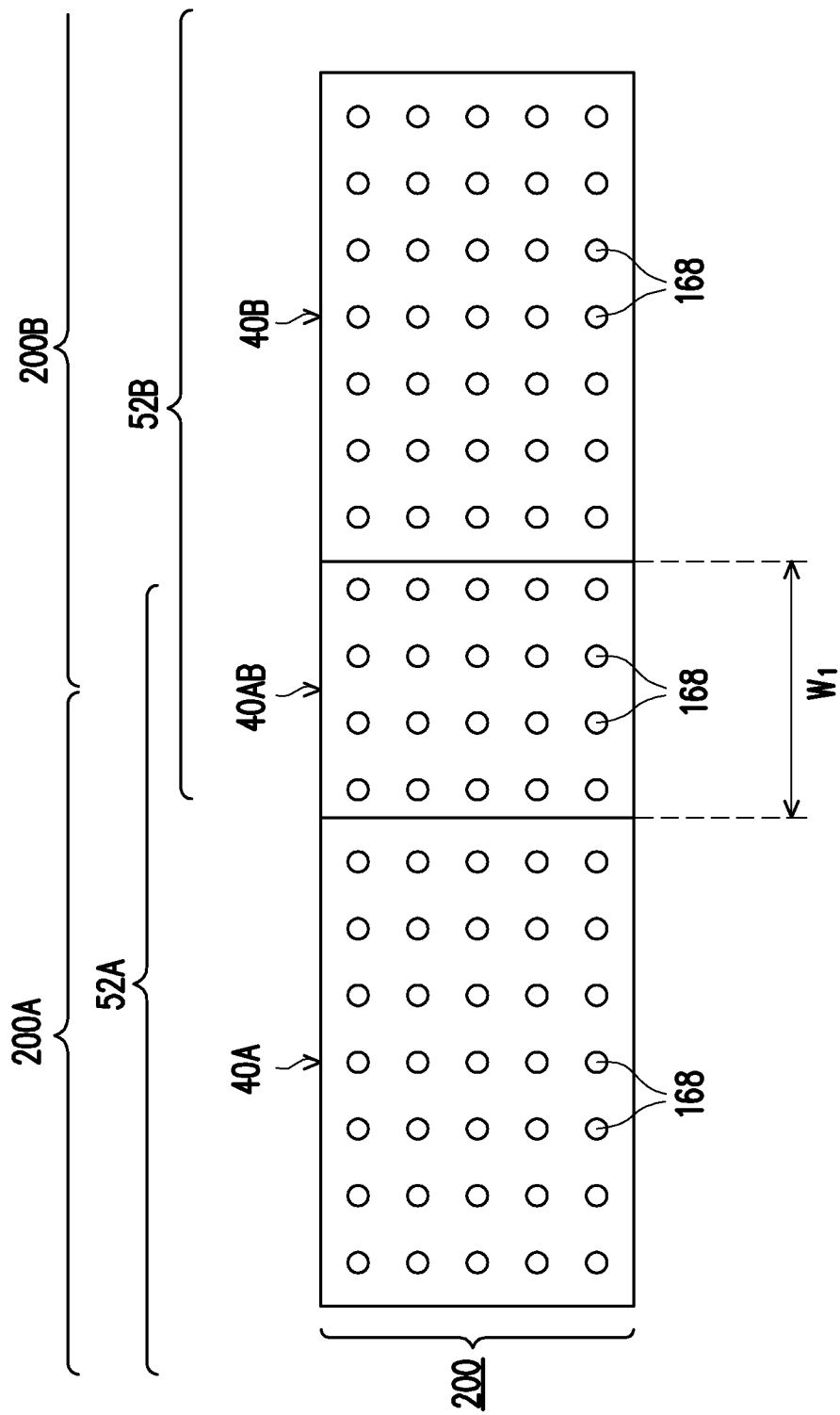

FIG. 15 illustrates a top view of the multi-shot reflow process. As shown, the laser shots 52A and 52B, each covering a rectangular region. The rectangular regions covered by the laser shots 52A and 52B may have the same size and shape. The combined region of the laser shots 52A and 52B fully covers the package regions 200A and 200B. The combined region may extend beyond the edges of the package regions 200A and 200B to provide enough process margin, so that all of the package regions 200A and 200B are covered by laser shots. As noted above, the overlap region 40AB receives two laser shots. The conductive connectors 168 in the overlap region 40AB are reflowed twice. In some embodiments, the overlap region 40AB has a width $W_1$ in the range of from about 1 mm to about 5 mm. Inside this width $W_1$, there may be a plurality of columns of the conductive connectors 168, for example, more than ten columns, depending on the pitch of the conductive connectors 168 and the overlap width $W_1$.

The multi-shot reflow process results in the local heating of the second package component 200 in each of the shots, rather than globally heating the entirety of both package components 100 and 200 at the same time. When a laser shot is performed after a preceding shot has ended, the increased temperature caused by the preceding laser shots has already been reduced. Heating the package components 100 and 200 causes wafer warpage, and the magnitude of the warpage is related to the heating temperature. By performing more localized heating, the overall heating temperature may be reduced, and warpage of the package components 100 and 200 may be reduced. In addition, the laser shots 52A and 52B are projected on the second package component 200, and the first package component 100 receives a very small dose (if any) of the laser beam directly. Accordingly, the first package component 100 is not heated significantly, and the corresponding warpage is reduced.

In the example illustrated in FIGS. 13 and 14, the regions 40A and 40B have an elongated top-view shape. In some embodiments, the regions 40A and 40B have other shapes. For example, FIG. 16A illustrates the package component 200 with multiple regions 40 having less-elongated shapes such as squares. The regions 40 may have any size or shape. In some embodiments, the regions 40 are 20 mm by 20 mm squares. FIG. 16B is a zoomed view of a region of FIG. 16A. The area shown in FIG. 16B may be heated by a multi-shot reflow process that includes six laser shots 52A through 52F. Each of the laser shots 52A through 52F may overlap. As a result, center points 42 receive four laser shots. The overlap regions of the laser shots 52A through 52F may in combination form cross shapes. The order of the laser shots 52A through 52F may be adjusted to any order as desirable.

Figure 17A:
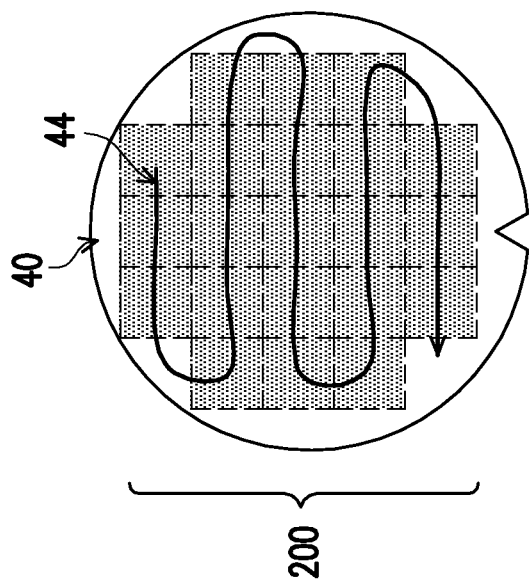
Figure 17B:
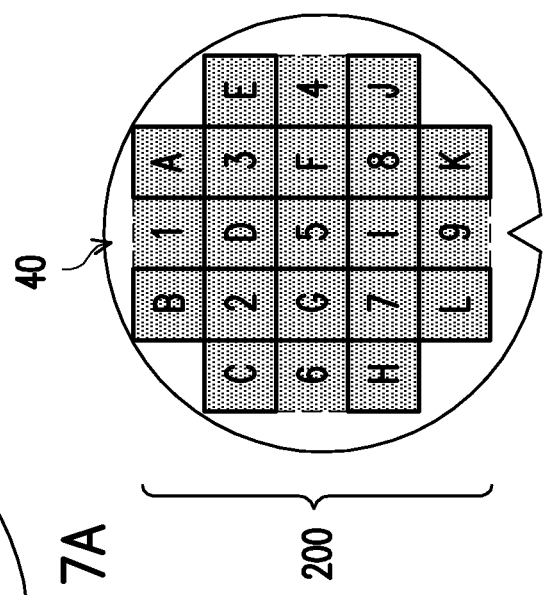
Figure 17C:
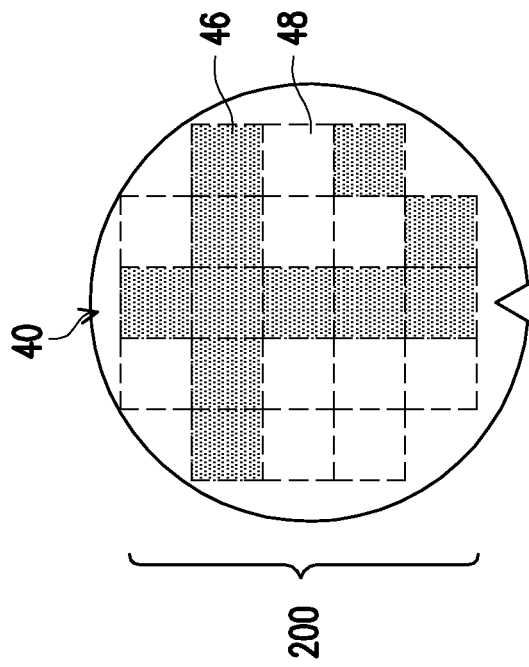

FIGS. 17A, 17B, and 17C show various laser shot patterns, in accordance with some embodiments. In FIG. 17A, the regions 40 of the second package component 200 are heated in a back-and-forth sweep across the second package component 200. Each row of the second package component 200 is sequentially heated, with each row being heated by sequentially heating each region 40 along the row. For example, regions 40 may be heated along an arrow 44 in FIG. 17A.

In FIG. 17B, the regions 40 are divided into several groups. Each group is sequentially heated, with each group being heated by sequentially heating each region 40 in the group. For example, in the embodiment shown, the regions 40 are divided into two groups: a first group (including regions 1 through 9) and a second group (including regions A through K). Each of the regions in the first group are sequentially heated. After the regions in the first group are heated, each of the regions in the second group are sequentially heated. In some embodiments, the first and second groups are heated under the same heating conditions, e.g., the same duration, unit power, etc. of the laser beam 52. In some embodiments, the first and second groups are heated under different heating conditions, e.g., different durations, unit powers, etc. of the laser beam 52.

In FIG. 17C, only a subset of the regions 40 are heated. For example, a custom shape or pattern of regions 40 may be predetermined. Only selected regions 46 in the predetermined shape are heated, and remaining regions 48 are not heated. The unheated regions 48 may be regions where no devices are packaged, or may be regions that are indirectly heated due to process variations of the laser beam 52.

Figure 18:
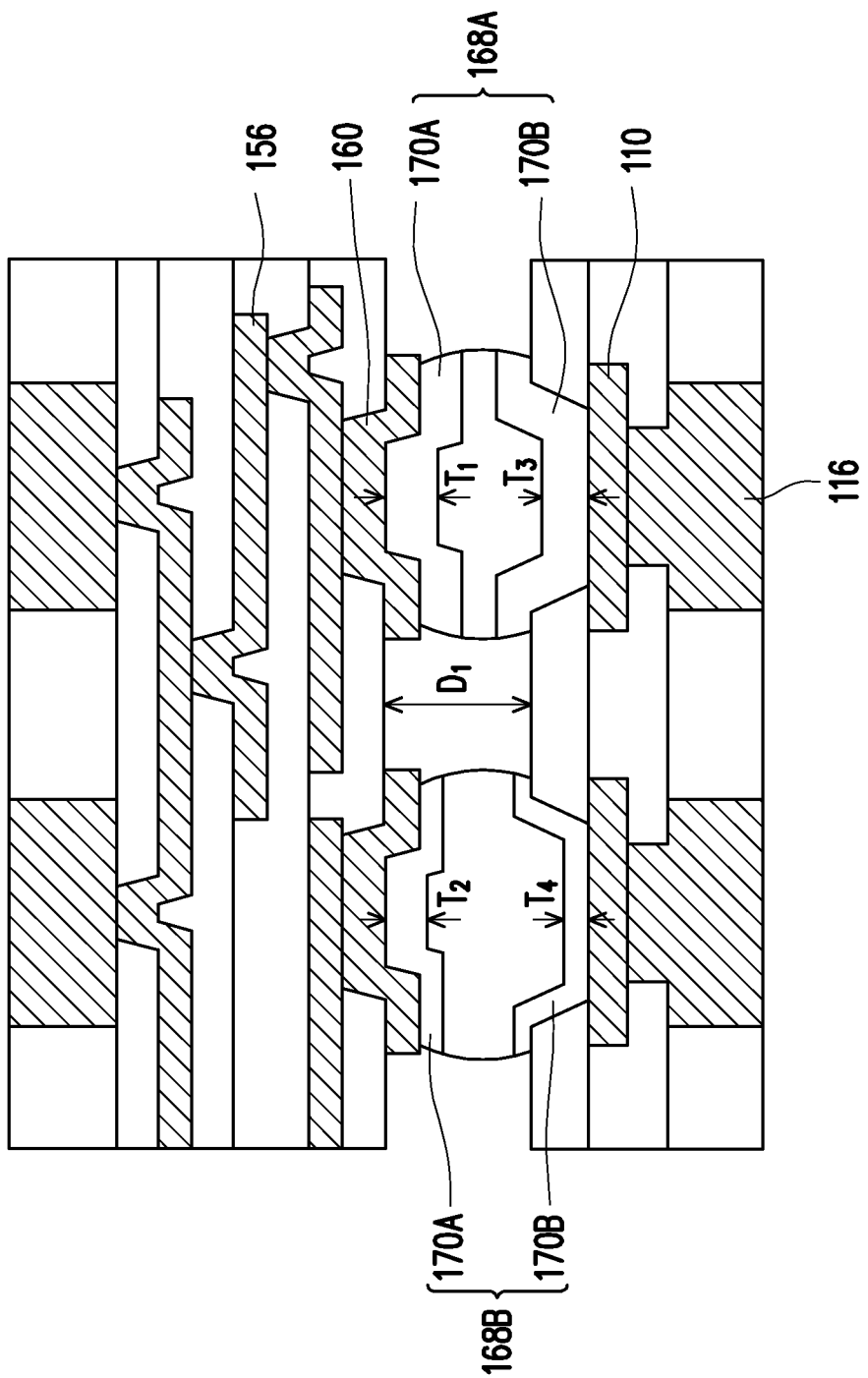

FIG. 18 illustrates a cross-sectional view of the conductive connectors 168 after formation. The conductive connectors 168 include conductive connectors 168A and 168B. The conductive connector 168A is a connector that was reflowed twice (e.g., was in the overlap region 40AB), and the conductive connector 168B is a connector that was reflowed once (e.g., was in the one of the regions 40 or 40B). During the multi-shot reflow process, inter-metallic compound (IMC) regions 170A and 170B are formed. The IMC regions 170A and 170B are compounds of the materials of the conductive connectors 168 and, respectively, the surface layers of the UBMs 160 and metallization pattern 110. Depending on the structure and the materials of the various conductive materials, the IMC regions 170A and 170B may be compounds of solder with nickel, copper, titanium, palladium, gold, aluminum, or the like. The corresponding IMC regions 170A and 170B are separated from each other by, and in contact with, the portions of the corresponding conductive connectors 168 that are not compounded with the metallization pattern 110 and UBMs 160. Due to the two (or more) reflow processes performed on the conductive connectors 168A, the thicknesses $T_1$ of the IMC regions 170A of the conductive connectors 168A are greater than the thicknesses $T_2$ of the IMC regions 170A of the conductive connectors 168B. The ratio of $T_1:T_2$ is greater than 1.0, and may be in the range of from about 1.2 to about 2.0. In accordance with some embodiments of the present disclosure, thickness $T_1$ is in the range of from about 7.2 µm to about 8 µm, and thickness $T_2$ is in the range of from about 4 µm to about 6 µm. Similarly, the thicknesses $T_3$ of the IMC regions 170B of the conductive connectors 168A are greater than the thicknesses $T_4$ of the IMC regions 170B of the conductive connectors 168B. The ratio of $T_3:T_4$ is greater than 1.0 and may be in the range of from about 1.2 to about 2.0. In accordance with some embodiments of the present disclosure, thickness $T_3$ is in the range of from about 7.2 µm to about 8 µm, and thickness $T_4$ is in the range of from about 4 µm to about 6 µm. Although particular thicknesses are discussed, it should be appreciated that IMCs (such as the IMC regions 170A and 170B) may have varying or non-uniform thicknesses. As such, the IMC thicknesses discussed here may be average thicknesses.

Although the conductive connectors 168 are shown as connecting the metallization pattern 110 and UBMs 160, it should be appreciated that the conductive connectors 168 may be used to connect to any conductive features of the package components 100 and 200. For example, the conductive connectors 168 may also physically connect to the through vias 116, such as in embodiments where the backside redistribution structure 106 is omitted. Likewise, the conductive connectors 168 may physically connect to the metallization pattern 156, such as in embodiments where the UBMs 160 are omitted.

Because the multi-shot reflow process reduces or avoids wafer warpage, the overall distance $D_1$ between the package components 100 and 200 may be more consistent across the different package regions. For example, the distance $D_1$ at edges of the package components 100 and 200 may be less than the distance $D_1$ at centers of the package components 100 and 200. Further, the distance $D_1$ may vary by less than 5% across the diameter of the package components 100 and 200.

The conductive connectors 168A with thicker IMC regions 170A and 170B may be allocated in strips that extend along the edge of the device packages in each respective package region (e.g., package regions 200A and 200B). In the resulting packages, there may be a single overlap strip or a plurality of overlap strips parallel to each other, which strips receive more than one (such as two or four) laser shots.

After the multi-shot reflow process is completed, the package components 100 and 200 may be cleaned in a cleaning process. The cleaning process may be, e.g., a flux clean, which help remove residual material. The flux clean may be performed by flushing, rinsing, or soaking using hot water or a cleaning solvent. Further, an underfill or encapsulant may optionally be injected between the package components 100 and 200, to surround the conductive connectors 168.

Figure 19:
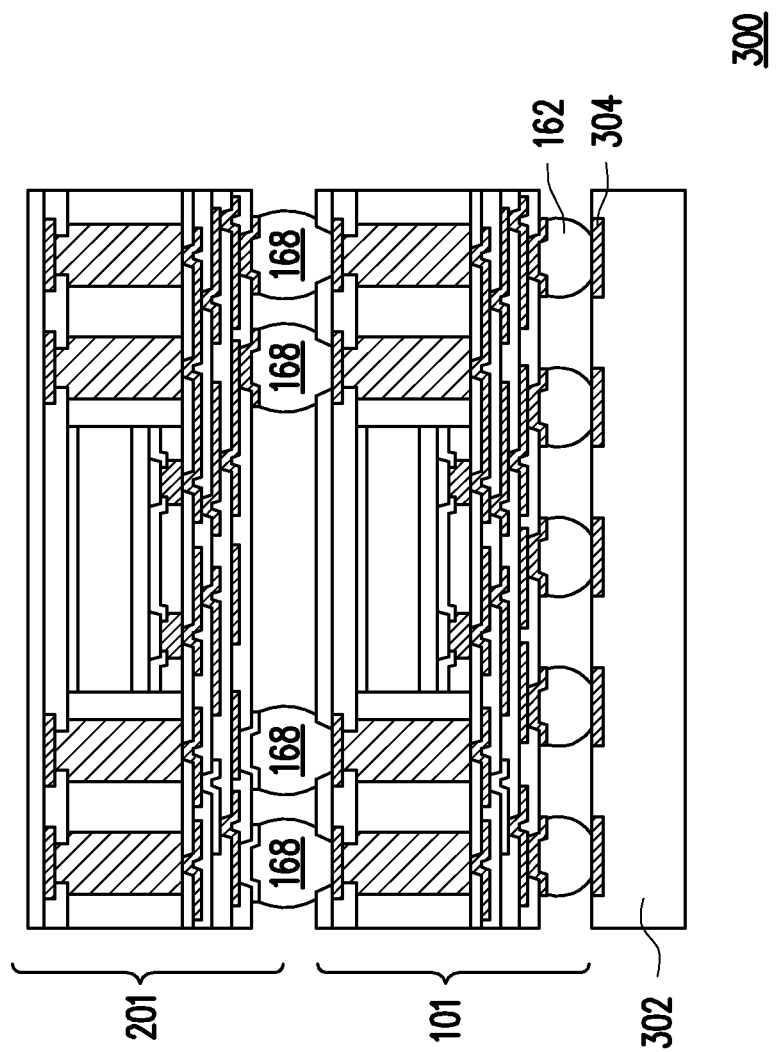

FIG. 19 illustrates a cross-sectional view of intermediate steps during a process for forming a package structure 300, in accordance with some embodiments. The package structure 300 may be referred to a package-on-package (PoP) structure.

A singulation process is performed by sawing along scribe line regions, e.g., between the package regions of the package components 100 and 200. The sawing singulates the adjacent package regions 100A, 100B, 200A, and 200B from the package components 100 and 200. The resulting singulated first packages 101 are from one of the first package region 100A or the second package region 100B, and the resulting singulated second packages 201 are from one of the first package region 200A or the second package region 200B.

The packages 101 and 201 are then mounted to a package substrate 302 using the conductive connectors 162. The package substrate 302 may be made of a semiconductor material such as silicon, germanium, diamond, or the like. Alternatively, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the package substrate 302 may be a SOI substrate. Generally, an SOI substrate includes a layer of a semiconductor material such as epitaxial silicon, germanium, silicon germanium, SOI, SGOI, or combinations thereof. The package substrate 302 is, in one alternative embodiment, based on an insulating core such as a fiberglass reinforced resin core. One example core material is fiberglass resin such as FR4. Alternatives for the core material include bismaleimide-triazine BT resin, or alternatively, other PCB materials or films. Build up films such as ABF or other laminates may be used for package substrate 302.

The package substrate 302 may include active and passive devices (not shown). As one of ordinary skill in the art will recognize, a wide variety of devices such as transistors, capacitors, resistors, combinations of these, and the like may be used to generate the structural and functional requirements of the design for the package structure 300. The devices may be formed using any suitable methods.

The package substrate 302 may also include metallization layers and vias (not shown) and bond pads 304 over the metallization layers and vias. The metallization layers may be formed over the active and passive devices and are designed to connect the various devices to form functional circuitry. The metallization layers may be formed of alternating layers of dielectric (e.g., low-k dielectric material) and conductive material (e.g., copper) with vias interconnecting the layers of conductive material and may be formed through any suitable process (such as deposition, damascene, dual damascene, or the like). In some embodiments, the package substrate 302 is substantially free of active and passive devices.

In some embodiments, the conductive connectors 162 are reflowed to attach the first package 101 to the bond pads 304. The conductive connectors 162 electrically and/or physically couple the package substrate 302, including metallization layers in the package substrate 302, to the first package 101. In some embodiments, passive devices (e.g., surface mount devices (SMDs), not illustrated) may be attached to the first package 101 (e.g., bonded to the bond pads 304) prior to mounting on the package substrate 302. In such embodiments, the passive devices may be bonded to a same surface of the first package 101 as the conductive connectors 162.

The conductive connectors 162 may have an epoxy flux (not shown) formed thereon before they are reflowed with at least some of the epoxy portion of the epoxy flux remaining after the first package 101 is attached to the package substrate 302. This remaining epoxy portion may act as an underfill to reduce stress and protect the joints resulting from the reflowing the conductive connectors 162. In some embodiments, an underfill (not shown) may be formed between the first package 101 and the package substrate 302 and surrounding the conductive connectors 162. The underfill may be formed by a capillary flow process after the first package 101 is attached or may be formed by a suitable deposition method before the first package 101 is attached.

Embodiments may achieve advantages. By performing multi-shot reflow processes, the warpage of the package components 100 and 200 may be reduced, and defects such as cold joints and solder bridging may be eliminated. More flexibility may be afforded during manufacturing by selectively heating areas of the package components 100 and 200. Manufacturing throughput may also be increased through the faster heating afforded by laser heating.

In an embodiment, a method includes: aligning a first package component with a second package component, the first package component having a first region and a second region, the first region including a first conductive connector, the second region including a second conductive connector; performing a first laser shot on a first portion of a top surface of the first package component, the first laser shot reflowing the first conductive connector of the first region, the first portion of the top surface of the first package component completely overlapping the first region; and after performing the first laser shot, performing a second laser shot on a second portion of the top surface of the first package component, the second laser shot reflowing the second conductive connector of the second region, the second portion of the top surface of the first package component completely overlapping the second region.

In some embodiments of the method, the first portion and the second portion of the top surface of the first package component partially overlap. In some embodiments of the method, the first conductive connector is heated by the second laser shot but is not reflowed by the second laser shot. In some embodiments of the method, performing the first laser shot includes: directing a laser beam at the first portion of the top surface of the first package component until the first conductive connector reflows; and after the first conductive connector reflows, turning off the laser beam until the first conductive connector solidifies. In some embodiments of the method, performing the second laser shot includes: after the first conductive connector solidifies, directing the laser beam at the second portion of the top surface of the first package component until the second conductive connector reflows. In some embodiments of the method, turning off the laser beam until the first conductive connector solidifies includes turning off the laser beam for a predetermined period of time, where the first conductive connector solidifies during the predetermined period of time. In some embodiments of the method, the first and second conductive connectors are disposed adjacent a bottom surface of the first package component, and where heat is transferred through the first package component to the first and second conductive connectors during the first and second laser shots. In some embodiments of the method, reflowing the first and second conductive connectors bonds the first package component to the second package component. In some embodiments, the method further includes: after the first package component is bonded to the second package component, singulating the first region from the second region to form a first device package. In some embodiments of the method, the first portion and the second portion of the top surface of the first package component overlap in a third region, the third region including a third conductive connector, the third conductive connector being reflowed by both the first laser shot and the second laser shot.

In an embodiment, a method includes: providing a first package component and a second package component, the first package component including first regions, the second package component including second regions; aligning the first regions of the first package component with the second regions of the second package component; performing laser shots on a top surface of the first package component, each of the laser shots being performed sequentially, each respective laser shot of the laser shots overlapping a respective first region of the first regions and a respective second region of the second regions, a conductive material between the respective first region and the respective second region being reflowed by the respective laser shot; and after performing the laser shots, singulating the first regions of the first package component and the second regions of the second package component.

In some embodiments of the method, performing the laser shots includes, for each respective laser shot: directing a laser beam at the respective first region of the first package component until the conductive material reflows, heat generated by the laser beam being transferred through the first package component to the conductive material; and after the conductive material reflows, turning off the laser beam until the conductive material cools. In some embodiments of the method, the laser shots are performed with the same unit power. In some embodiments of the method, the laser shots are performed for the same period of time. In some embodiments of the method, a first subset of the laser shots are performed with a first unit power and a second subset of the laser shots are performed with a second unit power, the second unit power being different from the first unit power. In some embodiments of the method, a first subset of the laser shots are performed for a first period of time and a second subset of the laser shots are performed for a second period of time, the second period of time being different from the first period of time. In some embodiments of the method, the laser shots are performed sequentially on all regions of the first package component. In some embodiments of the method, the laser shots are performed on a subset of regions of the first package component.

In an embodiment, a package includes: a first package including a first conductive feature and a second conductive feature; a second package including a third conductive feature and a fourth conductive feature; a first conductive connector joining the third conductive feature to the first conductive feature; a first inter-metallic compound (IMC) between the first conductive connector and the first conductive feature, the first IMC having a first thickness; a second conductive connector joining the fourth conductive feature to the second conductive feature; and a second IMC between the second conductive connector and the second conductive feature, the second IMC having a second thickness less than the first thickness.

In some embodiments of the package, the first package includes: a redistribution structure including the first conductive feature and the second conductive feature, the first and second conductive features being redistribution lines; an integrated circuit die on the redistribution structure; an encapsulant surrounding the integrated circuit die; and a conductive via extending through the encapsulant, the conductive via electrically connected to the integrated circuit die and the redistribution structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
 bonding a first package component to a second package component, the first package component comprising first conductive connectors in a first package region and second conductive connectors in a second package region, the first package region adjacent the second package region, the bonding comprising:
 projecting a laser beam at a first portion of the first package component until the first conductive connectors reflow, the first portion of the first package component overlapping each of the first conductive connectors and a subset of the second conductive connectors;

turning off the laser beam until the first conductive connectors solidify;
projecting the laser beam at a second portion of the first package component until the second conductive connectors reflow, the second portion of the first package component overlapping each of the second conductive connectors and a subset of the first conductive connectors; and
turning off the laser beam until the second conductive connectors solidify.

2. The method of claim 1, wherein the subset of the second conductive connectors are heated but are not reflowed when projecting the laser beam at the first portion of the first package component, and the subset of the first conductive connectors are heated but are not reflowed when projecting the laser beam at the second portion of the first package component.

3. The method of claim 1, wherein the first conductive connectors and the second conductive connectors are disposed at a front-side of the first package component.

4. The method of claim 3, wherein the laser beam is projected at a back-side of the first package component, and heat generated by the laser beam is transferred through the first package component to the front-side of the first package component.

5. The method of claim 1, wherein the turning off the laser beam until the first conductive connectors solidify comprises turning off the laser beam for a first predetermined period of time, and turning off the laser beam until the second conductive connectors solidify comprises turning off the laser beam for a second predetermined period of time, the first conductive connectors solidifying during the first predetermined period of time, the second conductive connectors solidifying during the second predetermined period of time.

6. The method of claim 1 further comprising:
after bonding the first package component to the second package component, singulating the first package region from the second package region.

7. The method of claim 1, wherein the first portion and the second portion of the first package component overlap in a third region, the third region overlapping the subset of the first conductive connectors and the subset of the second conductive connectors.

8. A method comprising:
aligning first regions of a first package component with second regions of a second package component;
performing laser shots on the first package component, each respective laser shot of the laser shots being performed sequentially in a different respective first region of the first regions of the first package component, a conductive material between the respective first region and a respective second region of the second regions of the second package component being reflowed by the respective laser shot, the respective laser shot only partially overlapping others of the laser shots; and
after performing the laser shots, singulating the first regions of the first package component and the second regions of the second package component.

9. The method of claim 8, wherein the laser shots are performed sequentially in a back-and-forth sweep across the first regions of the first package component.

10. The method of claim 8, wherein the laser shots are performed sequentially in different groups of the first regions of the first package component.

11. The method of claim 8, wherein the laser shots are performed sequentially in a predetermined pattern of the first regions of the first package component.

12. The method of claim 8, wherein each respective laser shot is performed by:
directing a laser beam at the respective first region until the conductive material reflows; and
after the conductive material reflows, turning off the laser beam until the conductive material cools.

13. The method of claim 12, wherein each respective laser shot is performed on a back-side of the first package component, and heat generated by the laser beam is transferred through the first package component to the conductive material.

14. The method of claim 8, wherein each respective laser shot is performed with the same unit power.

15. The method of claim 8, wherein each respective laser shot is performed for the same period of time.

16. A method comprising:
placing a first package component on a second package component, the first package component comprising first conductive connectors in a first package region and second conductive connectors in a second package region, the first package region adjacent the second package region;
reflowing the first conductive connectors by performing a first laser shot at the first package region, the second conductive connectors not reflowed by the first laser shot; and
reflowing the second conductive connectors by performing a second laser shot at the second package region, the first conductive connectors not reflowed by the second laser shot.

17. The method of claim 16, wherein the first laser shot and the second laser shot are performed at different heating conditions.

18. The method of claim 16, wherein the first laser shot and the second laser shot are performed at the same heating condition.

19. The method of claim 16 further comprising:
after reflowing the first conductive connectors, waiting until the first conductive connectors solidify before reflowing the second conductive connectors.

20. The method of claim 16, wherein the first conductive connectors and the second conductive connectors are disposed at a front-side of the first package component, and the first laser shot and the second laser shot are performed at a back-side of the first package component.

* * * * *